(12) United States Patent
Ho et al.

(10) Patent No.: US 12,417,969 B2
(45) Date of Patent: Sep. 16, 2025

(54) SEMICONDUCTOR STRUCTURE AND CIRCUIT STRUCTURE

(71) Applicant: Taiwan Semiconductor Manufacturing Company, Ltd., Hsinchu (TW)

(72) Inventors: Kuan-Lin Ho, Hsinchu (TW); Chin-Liang Chen, Kaohsiung (TW); Pei-Rong Ni, Hsinchu (TW); Chia-Min Lin, Hsinchu (TW); Yu-Min Liang, Taoyuan (TW); Jiun-Yi Wu, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 238 days.

(21) Appl. No.: 18/162,620

(22) Filed: Jan. 31, 2023

(65) Prior Publication Data

US 2023/0178466 A1   Jun. 8, 2023

Related U.S. Application Data

(62) Division of application No. 17/351,253, filed on Jun. 18, 2021, now Pat. No. 11,594,479.

(51) Int. Cl.
*H01L 23/498* (2006.01)
*H01L 21/48* (2006.01)

(52) U.S. Cl.
CPC .... *H01L 23/49833* (2013.01); *H01L 21/4857* (2013.01); *H01L 23/49816* (2013.01); *H01L 23/49822* (2013.01)

(58) Field of Classification Search
CPC . H01L 21/48; H01L 23/498; H01L 23/49833; H01L 21/4857; H01L 23/49816; H01L 23/49822
USPC .......................................................... 174/250
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |

*Primary Examiner* — Tremesha W Burns
(74) *Attorney, Agent, or Firm* — JCIPRNET

(57) ABSTRACT

A semiconductor structure and a manufacturing method thereof are provided. The semiconductor structure includes a redistribution structure, conductive joints, conductive terminals, a circuit substrate, and an insulating encapsulation. The redistribution structure includes a first side and a second side opposite to the first side, wherein trenches are located on the second side of the redistribution structure and extend to an edge of the second side of the redistribution structure. The conductive joints are disposed over the first side of the redistribution structure. The conductive terminals are disposed over the second side of the redistribution structure. The circuit substrate electrically coupled to the redistribution structure through the conductive joints. The insulating encapsulation is disposed on the first side of the redistribution structure to cover the circuit substrate.

20 Claims, 23 Drawing Sheets

SEMICONDUCTOR STRUCTURE AND CIRCUIT STRUCTURE

CROSS-REFERENCE TO RELATED APPLICATION

This is a divisional application of and claims the priority benefit of a prior application Ser. No. 17/351,253, filed on Jun. 18, 2021, which is now allowed. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
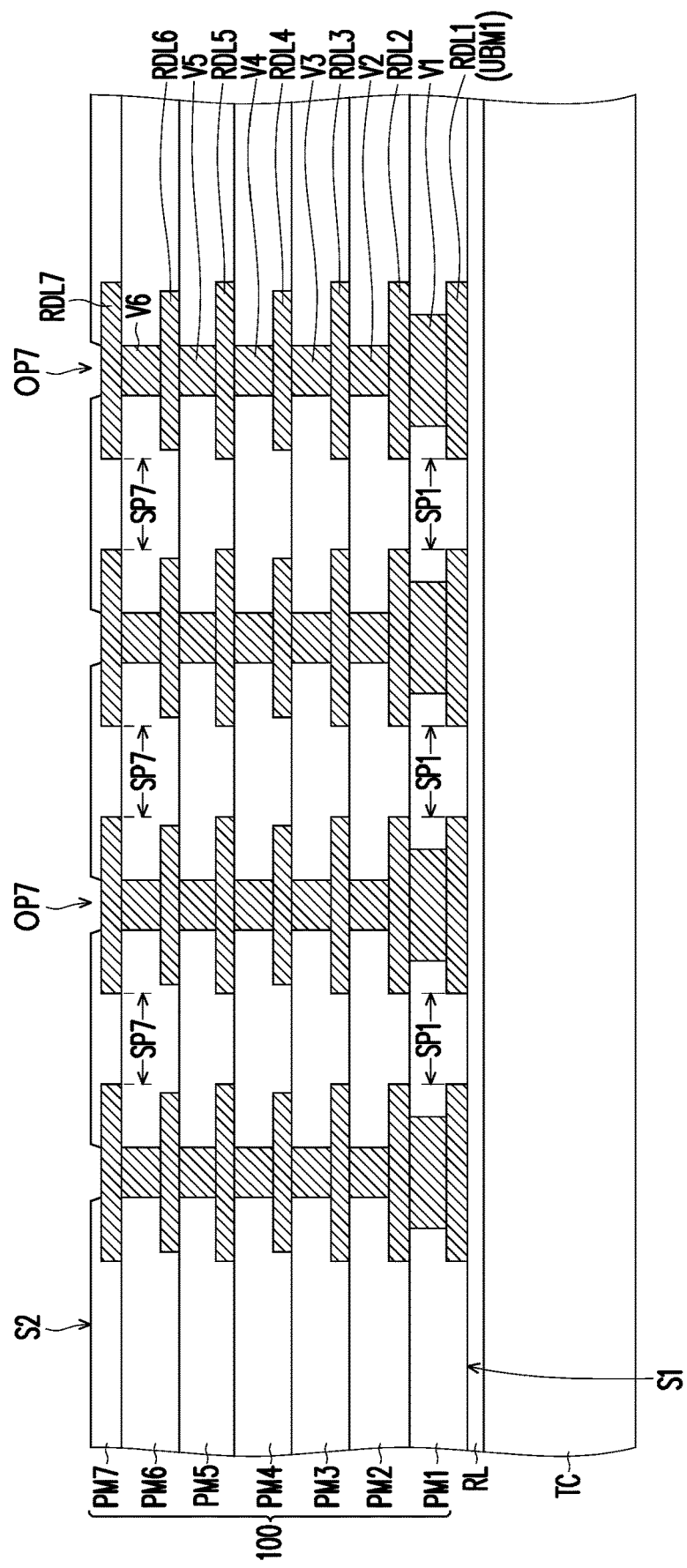
FIGS. 1A-1I are schematic cross-sectional views of various stages of manufacturing a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1I are schematic cross-sectional views of various stages of manufacturing a semiconductor structure in accordance with some embodiments, and FIGS. 2A-2I are schematic top views corresponding to FIGS. 1A-1I in accordance with some embodiments.

Figure 2A:
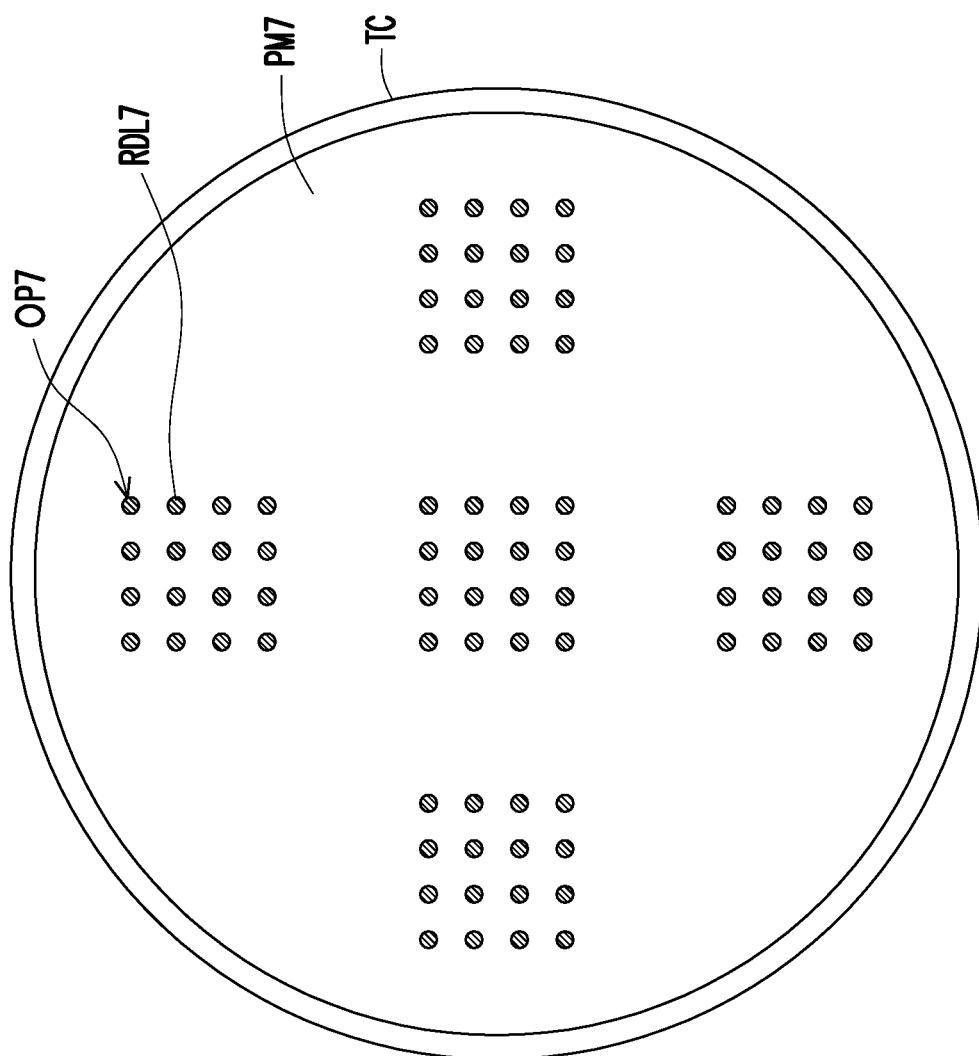
FIGS. 2A-2I are schematic top views corresponding to FIGS. 1A-1I in accordance with some embodiments.

Referring to FIGS. 1A and 2A, a redistribution structure 100 including dielectric layers and redistribution layers is formed over a temporary carrier TC. For example, a material of the temporary carrier TC includes glass, silicon, metal, ceramic, combinations thereof, multi-layers thereof, and/or the like. In some embodiments, the temporary carrier TC is provided in a wafer form. Alternatively, the temporary carrier TC may have a rectangular shape or other suitable shape. The temporary carrier TC may be planar to accommodate the formation of features subsequently formed thereon. In some embodiments, the temporary carrier TC is provided with a release layer RL to facilitate a subsequent de-bonding of the temporary carrier TC. The release layer RL may include a layer of light-to-heat-conversion (LTHC) release coating and a layer of associated adhesive. Other suitable release material (e.g., pressure sensitive adhesives, radiation curable adhesives, combinations of these, etc.), which may be removed along with the temporary carrier TC from the overlying structures that will be formed in subsequent steps, may be used. Alternatively, the release layer RL is omitted.

The redistribution structure 100 includes a first side S1 and a second side S2 opposite to the first side S1. The first side S1 of the redistribution structure 100 is facing the temporary carrier TC. For example, the first side S1 of the redistribution structure 100 is in contact with the release layer RL.

In some embodiments, the redistribution structure 100 includes the first to seventh dielectric layers PM1~PM7 stacked over the carrier C, the first to seventh conductive patterns RDL1~RDL7, and the first to seventh conductive vias V1~V6. The first to seventh conductive patterns RDL1~RDL7 and the first to seventh conductive vias V1~V6 respectively embedded in the dielectric layers PM1~PM7. For example, the dielectric layers PM1~PM7 may include polybenzoxazole (PBO), polyimide (PI), benzocyclobutene (BCB), prepreg, Ajinomoto build-up film (ABF), an oxide (e.g., silicon oxide), a nitride (e.g., silicon nitride), a photosensitive polymer material, a combination thereof, and/or the like. In some embodiments, the dielectric layers PM1~PM7 may include resin mixed with filler. For example, the material of the first to seventh conductive patterns RDL1~RDL7 and the first to seventh conductive vias V1~V6 may include copper or other suitable metallic materials.

In some embodiments, the first conductive pattern RDL1 may be formed over the temporary carrier TC. The first conductive pattern RDL1 may be or may include a first under-bump metallization (UBM) pattern UBM1 for the subsequently formed element landing thereon. In a top-down view, the first UBM pattern UBM1 may be formed in a desired shape, such as a circular, oval, square, rectangular, or polygonal shape, although any desired shape may alternatively be formed.

In some embodiments, after forming the first conductive pattern RDL1, a first conductive via V1 is formed on the first conductive pattern RDL1. The material of the first conductive via V1 may be similar to the first conductive pattern RDL1. In some embodiments, the first conductive pattern RDL1 and the first conductive via V1 are collectively viewed as a redistribution layer at the first level of the redistribution structure 100.

In some embodiments, after forming the first conductive via V1, a first dielectric layer PM1 is formed over the temporary carrier TC to cover the first conductive pattern RDL1 and the first conductive via V1. For example, a dielectric material is formed on the release layer RL by a process such as lamination, spin-coating, CVD, a combination thereof, etc. The dielectric material is optionally planarized, such as by a chemical mechanical polish (CMP) or a mechanical grinding, to form the first dielectric layer PM1. In some embodiments, the first conductive vias V1 includes substantially vertical sidewalls relative to the top surface of the underlying first conductive pattern RDL1.

Continue to FIG. 1A, a second conductive pattern RDL2, second conductive vias V2, and a second dielectric layer PM2 are then formed on the first conductive vias V1 and the first dielectric layer PM1. The second conductive pattern RDL2 and the second conductive vias V2 are collectively viewed as a redistribution layer at the second level to provide additional routing. The second conductive pattern RDL2, the second conductive vias V2, and the second dielectric layer PM2 are formed using the processes similar to the formation of the first conductive pattern RDL1, the first conductive vias V1, and the second dielectric layer PM2. In some embodiments, the second conductive pattern RDL2 is form on the first conductive vias V1 and may extend from the top surface of the first conductive vias V1 to the top surface of the first dielectric layer PM1. The second conductive vias V2 are form on the second conductive pattern RDL2. The materials of the second conductive pattern RDL2 and the second conductive vias V2 may be similar to those of the first conductive pattern RDL1 and the first conductive vias V1. Subsequently, the second dielectric layer PM2 is formed on the first dielectric layer PM1 to cover the second conductive vias V2 and the second conductive pattern RDL2 using the processes similar to the formation of the first dielectric layer PM1. The material of the second dielectric layer PM2 may be similar to or different from the first dielectric layer PM1 depending on product and process requirements.

In some alternative embodiments, the first dielectric layer PM1 having openings is formed over the temporary carrier TC, and then the first conductive vias V1 may be formed on the first conductive pattern RDL1 within the openings of the first dielectric layer PM1. In some embodiments, the first conductive vias V1 includes inclined sidewalls relative to the top surface of the underlying first conductive pattern RDL1. The second conductive pattern RDL2 and the first conductive vias V1 may be formed during the same step. Under this scenario, the planarization process may be omitted, and there is no visible interface between the second conductive pattern RDL2 and the underlying first conductive vias V1.

Still referring to FIG. 1A, additional conductive patterns (e.g., RDL3, RDL4, RDL5, RDL6, and RDL7), conductive vias (e.g., V3, V4, V5, and V6), and dielectric layers (e.g., PM3, PM4, PM5, PM6, and PM7) may be formed over the second conductive vias V2 and the second dielectric layer PM2 to provide additional routing. The dielectric layers and the redistribution layers may be alternately formed, and may be formed using processes and materials similar to those used for the underlying dielectric layer or the redistribution layers. The steps of forming the conductive patterns, the conductive vias, and the dielectric layers may be repeated to form the redistribution structure 100. It is noted that the redistribution structure 100 shown in FIG. 1A is merely an example and number of dielectric layers and redistribution layers can be adjusted according to needs. It is also noted that the arrangement of the conductive vias V1-V6 shown in FIG. 1A is merely an example, and the conductive vias V1-V6 may be fully staggered or partially staggered in the cross-sectional view.

In some embodiments, the bottommost conductive via (e.g., the first conductive via V1) may have a critical dimension greater than the critical dimension of the topmost conductive via (e.g., the sixth conductive via V6). In some embodiments, the redistribution structure 100 is a fan-out structure. The redistribution layers in the redistribution structure 100 may be fan-out from the topmost level (e.g., RDL7) to the bottommost level (e.g., RDL1).

For example, the spacing SP1 of the first conductive pattern RDL1 at the bottommost level of the redistribution structure 100 is greater than the spacing SP7 of the seventh conductive pattern RDL7 at the topmost level of the redistribution structure 100. For example, the spacing SP1 of the first conductive pattern RDL1 is in a range of about 30 μm and about 1000 μm. The spacing SP7 of the seventh conductive pattern RDL7 at the topmost level of the redistribution structure 100 may range from about 0.1 μm to about 30 μm.

In some embodiments, at least the topmost dielectric layer (e.g., the seventh dielectric layer PM7) is formed differently from the underlying dielectric layer (e.g., the sixth dielectric layers PM6) or any other dielectric layer below the topmost dielectric layer. For example, the topmost dielectric layer (e.g., the seventh dielectric layer PM7) is formed of a polymer material such as PBO, PI, or the like, and the dielectric layers below the topmost dielectric layer may be formed of a different material, such as by being formed of an ABF or a prepreg material. In some embodiments, the topmost dielectric layer (e.g., the seventh dielectric layer PM7) has a thickness different from the underlying dielectric layer (e.g., the sixth dielectric layers PM6). However, any combination of materials and thicknesses may be utilized.

Still referring to FIG. 1A and with reference to FIG. 2A, in some embodiments, the topmost dielectric layer (e.g., the seventh dielectric layer PM7) is a patterned dielectric layer including openings OP7. That is, the second side S2 of the redistribution structure 100 has the openings OP7. At least a portion of the underlying conductive pattern (e.g., the seventh conductive pattern RDL7) is exposed by the openings OP7 for further electrical connection.

The first dielectric layer PM1 and the first conductive pattern RDL1 are located at the first side S1 of the redistribution structure 100, wherein the first conductive pattern RDL1 is substantially flush with the first dielectric layer PM1. The first side S1 of the redistribution structure 100 includes a bottom surface of the bottommost conductive pattern (e.g., the first conductive pattern RDL1) and a bottom surface of the bottommost dielectric layer (e.g., the first dielectric layer PM1).

An N-th dielectric layer (e.g., the seventh conductive pattern RDL7) and an N-th conductive pattern (e.g., the seventh conductive pattern RDL7) disposed under the N-th dielectric layer (e.g., the seventh conductive pattern RDL7) are located at the second side S2 of the redistribution structure 100. The second side S2 of the redistribution structure 100 includes a top surface of the topmost conductive pattern (e.g., the seventh conductive pattern RDL7) exposed by the openings OP7 and a top surface of the topmost dielectric layer (e.g., the seventh dielectric layer PM7).

Figure 1B:
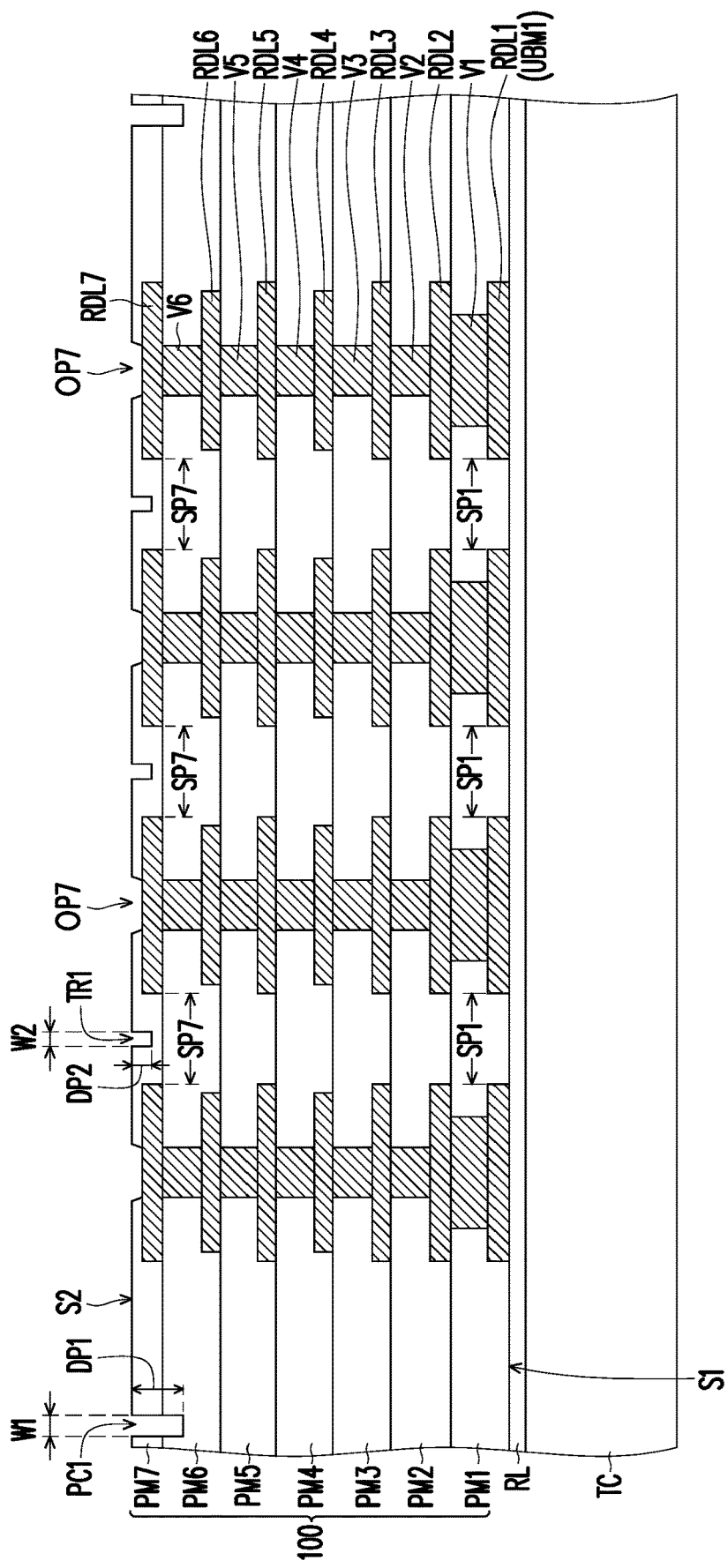
Figure 2B:
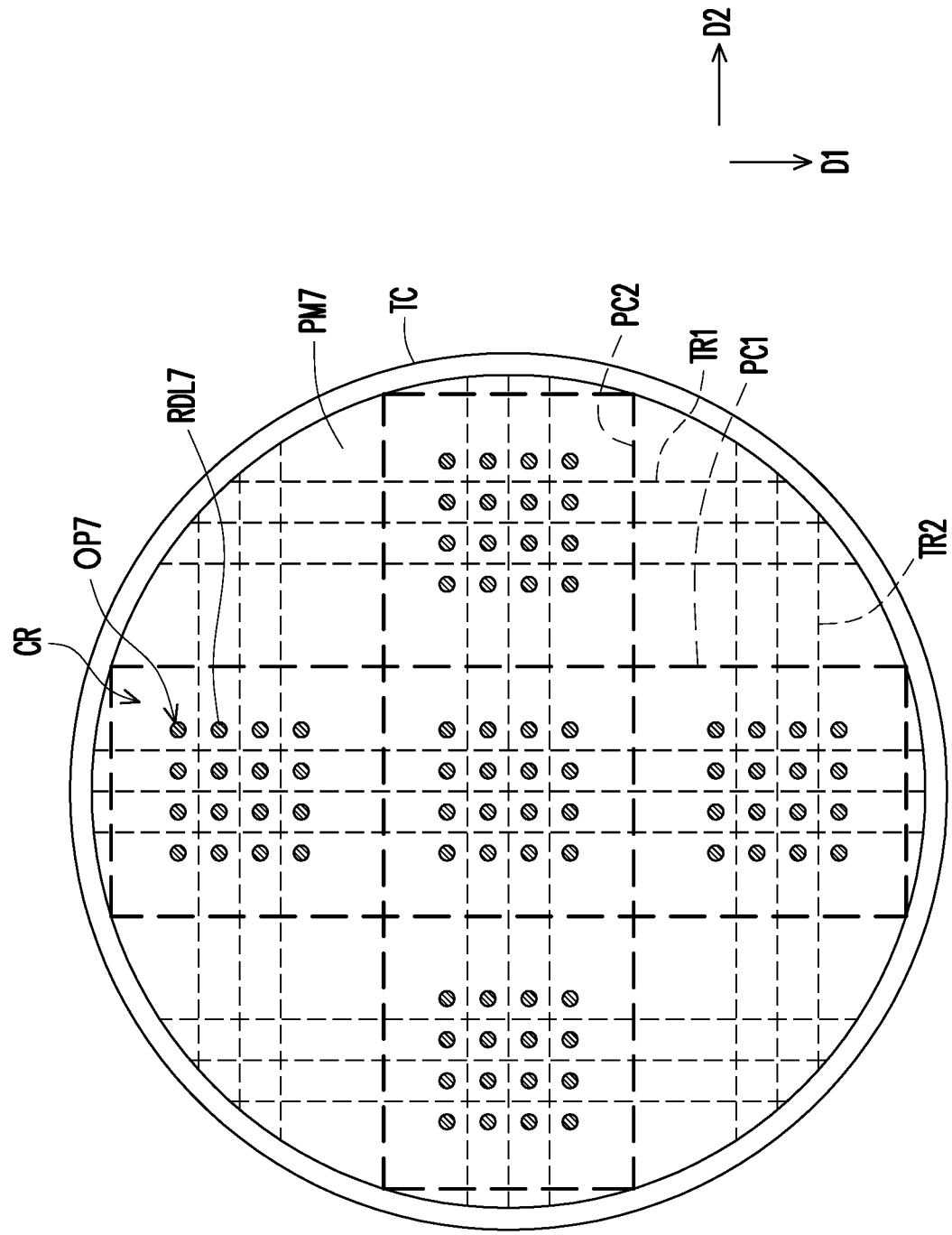

Referring to FIGS. 1B and 2B, one or more cutting processes are used to form trenches TR1, TR2 and pre-cut grooves PC1, PC2 on the second side S2 of the redistribution structure 100. Portions of the redistribution structure 100 including dielectric materials are removed in the cutting processes. For example, portions of the topmost dielectric layer (e.g., the seventh dielectric layer PM7) are removed to form the trenches TR1, TR2 and the pre-cut grooves PC1, PC2. In some embodiments, other dielectric layer (e.g., the fifth dielectric layer PM5, the sixth dielectric layer PM6, or other dielectric layer) may also be partially removed in the cutting processes. In other words, the trenches TR1, TR2 and/or the pre-cut grooves PC1, PC2 may extend from the topmost dielectric layer into the underlying dielectric layer(s). In some embodiments, not only dielectric materials but also conductive materials may be removed in the cutting processes. The cutting processes can use laser cutting, laser micro-jet cutting, bevel cutting, blade sawing, or the like. The pre-cut grooves PC1, PC2 and the trenches TR1, TR2 may be formed by the cutting processes similar to each other or the cutting processes different from each other.

In the embodiment, the trenches TR1, TR2 and the pre-cut grooves PC1, PC2 are formed by the processes different form the formation of the openings OP7, but the disclosure is not limited thereto. In other embodiments, the trenches TR1, TR2 and/or the pre-cut grooves PC1, PC2 are formed by the formation process (e.g., etching process or the like) of the openings OP7. That is, the trenches TR1, TR2 and/or the pre-cut grooves PC1, PC2 may be formed together with the openings OP7.

In a top-down view, the pre-cut grooves PC1 are extending along a first direction D1 which is angled with the extending direction (e.g., a second direction D2) of the pre-cut grooves PC2. In some embodiments, the first direction D1 is perpendicular to the second direction D2, but the disclosure is not limited thereto. In the embodiment, the cutting process forming the pre-cut grooves PC1, PC2 is also referred to a pre-cutting process defining a cutting region of a singulation process. For example, in a top-down view, circuit regions CR of the redistribution structure 100 are defined by the pre-cut grooves PC1, PC2 and arranged in an array over the temporary carrier TC. In other words, each of the circuit regions CR is surrounded by the pre-cut grooves PC1, PC2. The openings OP7 of the topmost dielectric layer (e.g., the seventh dielectric layer PM7) may be distributed within the circuit regions CR. In some embodiments, each of the circuit regions CR may be similarly sized and shaped, although in other embodiments the circuit regions CR may have different sizes and shapes.

The trenches TR1 and the trenches TR2 are extending along different directions. The trenches TR1 are extending along the first direction D1 which is angled with the extending direction (e.g., a second direction D2) of the trenches TR2, but the disclosure is not limited thereto. In the embodiment, the trenches TR1 are parallel with the pre-cut grooves PC1, and the trenches TR2 are parallel with the pre-cut grooves PC2. In other embodiments, the trenches TR1 are angled with the pre-cut grooves PC1, PC2, and the trenches TR2 are also angled with the pre-cut grooves PC1, PC2.

The trenches TR1, TR2 are used as a gas channel during a subsequent heating process. The trenches TR1, TR2 extend to an edge of the second side S2 of the redistribution structure 100 so that the gas generated during the subsequent heating process can flow along the trenches TR1, TR2 and be released from the edge of the redistribution structure 100. In some embodiments, two ends of each of the trenches TR1, TR2 are connected with the edge of the second side S2 of the redistribution structure 100.

In some embodiments, a width W1 of each of the pre-cut grooves PC1, PC2 is larger than or equal to a width W2 of each of the trenches TR1, TR2. In some embodiments, width W1 of each of the pre-cut grooves PC1, PC2 is in a range from 1 μm to 10000 μm. In some embodiments, width W2 of each of the trenches TR1, TR2 is in a range from 1 μm to 10000 μm. In some embodiments, a depth DP1 of each of the pre-cut grooves PC1, PC2 is larger than or equal to a depth DP2 of each of the trenches TR1, TR2. In some embodiments, depth DP1 of each of the pre-cut grooves PC1, PC2 is in a range from 5 μm to 50 μm. In some embodiments, depth DP2 of each of the trenches TR1, TR2 is in a range from 5 μm to 50 μm.

In FIG. 1B, each of the trenches TR1, TR2 and the pre-cut grooves PC1, PC2 includes substantially vertical sidewalls relative to the top surface of the topmost dielectric layer (e.g., the seventh dielectric layer PM7), but the disclosure is not limited thereto. In other embodiments, each of the trenches TR1, TR2 and the pre-cut grooves PC1, PC2 includes inclined sidewalls relative to the top surface of the topmost dielectric layer (e.g., the seventh dielectric layer PM7).

Figure 1C:
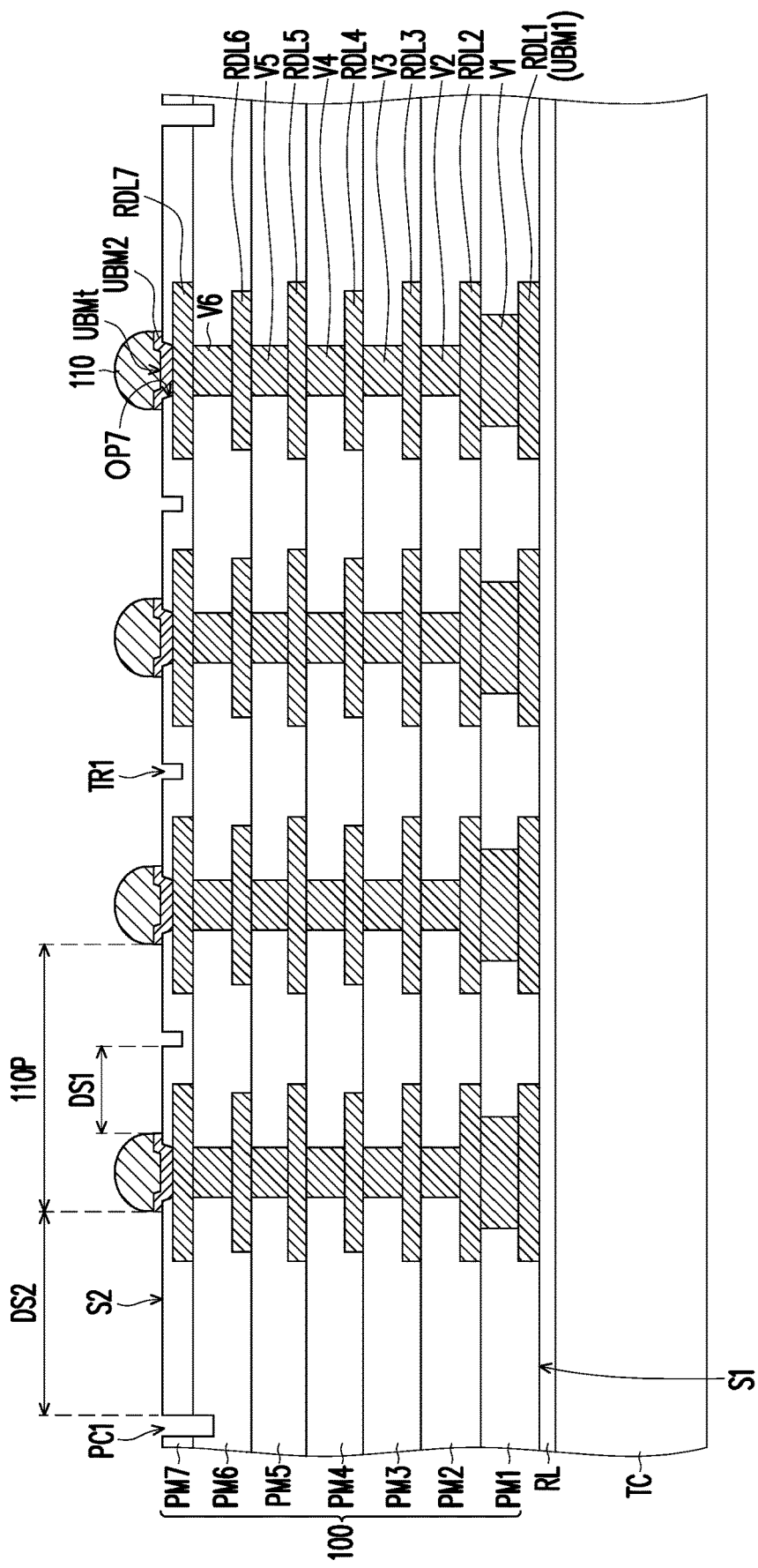
Figure 2C:
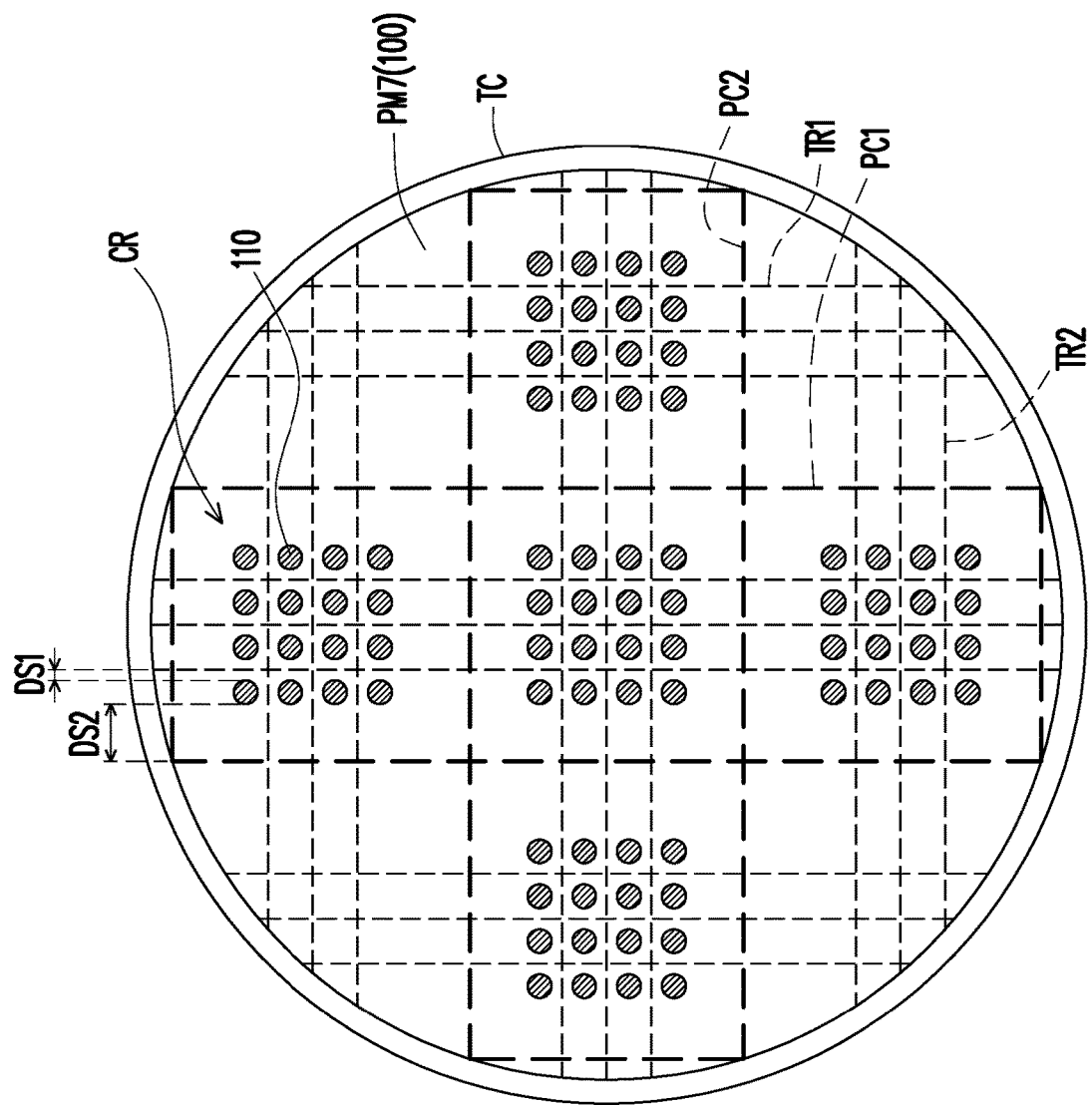

Referring to FIGS. 1C and 2C, a second UBM pattern UBM2 and conductive terminals 110 may be sequentially formed over the second side S2 of the redistribution structure 100 and in the openings OP7 of the topmost dielectric layer (e.g., the seventh dielectric layer PM7) for further electrical connection. The second UBM pattern UBM2 may be a single layer or may include a plurality of layers conformally formed in the openings OP7 and on the topmost dielectric layer (e.g., the seventh dielectric layer PM7). In some embodiments, the second UBM pattern UBM2 has a recessed top surface UBMt corresponding to each of the openings OP7. For example, the second UBM pattern UBM2 includes multiple layers of conductive materials, such as a layer of titanium, a layer of copper, and a layer of nickel. In such embodiments, the layer of titanium is conformally formed on the topmost dielectric layer (e.g., the seventh dielectric layer PM7) to be in physical and electrical contact with the conductive pattern (e.g., the seventh conductive pattern RDL7) exposed by the openings OP7 of the topmost dielectric layer (e.g., the seventh dielectric layer PM7), and then the layer of copper and the layer of nickel are sequentially formed on the layer of titanium. In some embodiments, the second UBM pattern UBM2 includes an arrangement of titanium/titanium tungsten/copper, an arrangement of copper/nickel/gold, or other materials or layers of material. Each layer of the second UBM pattern UBM2 may be formed by such as plating sputtering, evaporation, or other suitable deposition process depending upon the desired materials. After deposition of the desired layers, lithography and etching processes may be performed to form the second UBM pattern UBM2 in a desired shape. For example, the shape of the second UBM pattern UBM2 may be circular, oval, square, rectangular, polygon, etc.

In some embodiments, the conductive terminals 110 are formed on the second UBM pattern UBM2. For example, a pitch 110P of the adjacent conductive terminals 110 is less than 130 μm. In some embodiments, the pitch 110P of the adjacent conductive terminals 110 is less than 10 μm. It is noted that the pitches of the conductive terminals 110 may be adjusted depending on I/O connectors of a semiconductor device (e.g., the semiconductor device 500 shown in FIG. 11) that is to be mounted thereon. The conductive terminals 110 may be or may include solder balls, ball grid array (BGA) connectors, metal pillars, controlled collapse chip connection (C4) bumps, micro bumps, electroless nickel-electroless palladium-immersion gold (ENEPIG) formed bumps, or the like. For example, the conductive terminals 110 are formed by such as plating, ball placement, evaporation, printing, etc. In some embodiments, the conductive terminals 110 includes solder bump formed by landing solder balls on the recessed top surface UBMt of the second UBM pattern UBM2, and then reflowing the solder material. In some embodiments, the respective conductive terminal 110 includes a lead-free pre-solder layer, Sn—Ag, or solder material including alloys of tin, lead, nickel, bismuth, silver, copper, combinations thereof, or the like. In some embodiments, the conductive terminals 110 are formed by plating a solder layer with lithography process followed by reflowing process to reshape the solder layer into the desired bump shapes. In some embodiments, the reflow process is omitted. Alternatively, the second UBM pattern UBM2 is omitted, and the conductive terminals 110 are in physical and electrical contact with the underlying conductive pattern (e.g., the seventh conductive pattern RDL7).

In some embodiments, a distance DS2 between the conductive terminal 110 and the trenches TR1, TR2 is smaller than a distance DS1 between the conductive terminal 110 and the pre-cut grooves PC1, PC2. The distance DS2 can be defined as the shortest distance between the conductive terminal 110 and an adjacent trench TR1 or an adjacent trench TR2. The distance DS1 can be defined as the shortest distance between the conductive terminal 110 and an adjacent pre-cut grooves PC1 or an adjacent pre-cut grooves PC2. For example, the distance DS1 is in a range from 1 μm to 10000 μm, the distance DS2 is in a range from 1 μm to 10000 μm.

Figure 1D:
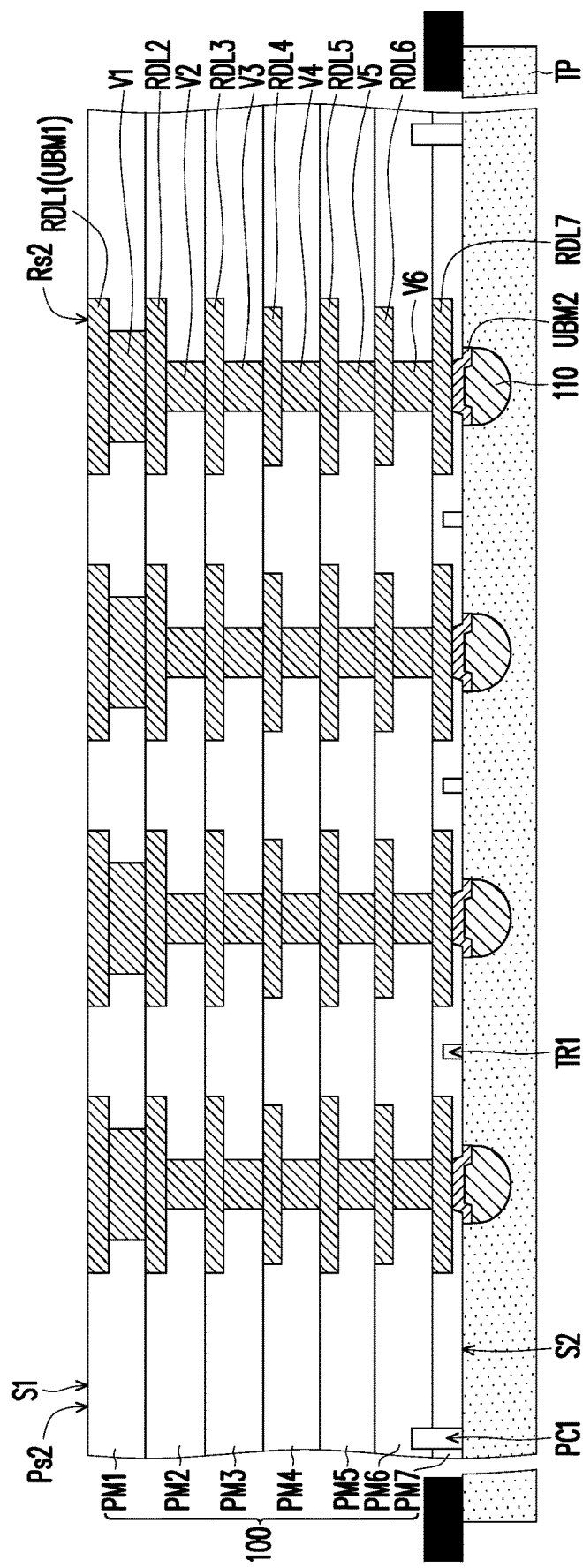
Figure 2D:
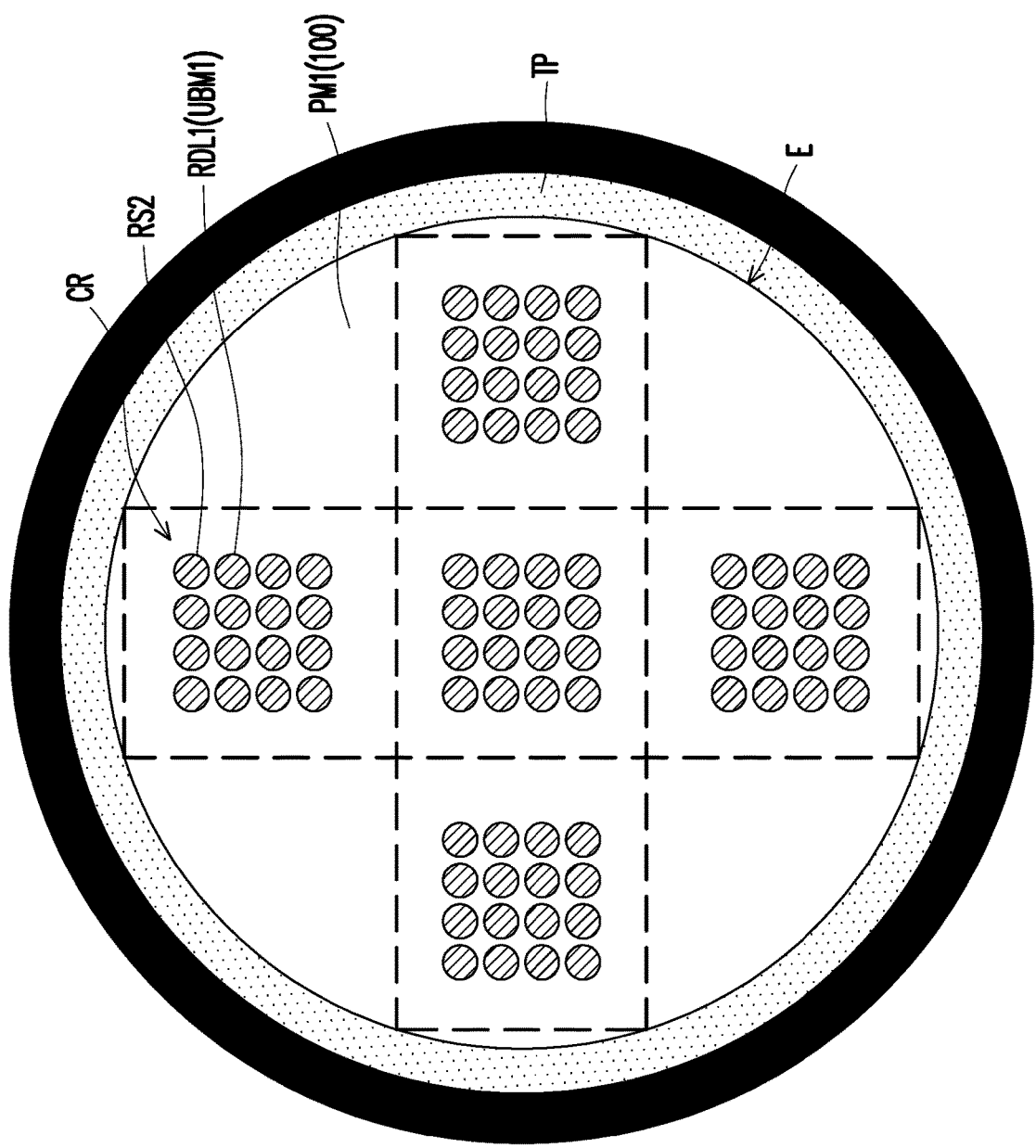

Referring to FIGS. 1D and 2D and also with reference to FIG. 1C, the temporary carrier TC may be de-bonded from the redistribution structure 100, and the redistribution structure 100 may be disposed on a tape frame TP. In some embodiments, the temporary carrier TC and the release layer RL are physically separated and removed from the redistribution structure 100, so that the first dielectric layer PM1 and the first conductive pattern RDL1 (i.e. the first UBM pattern UBM1) are exposed for further processing. In some embodiments, the first side S1 of the redistribution structure 100 is facing away the tape frame TP, and the first dielectric layer PM1 and the first conductive pattern RDL1 are exposed. In some embodiments, an exposed surface Ps2 of the first dielectric layer PM1 and an exposed surface Rs2 of the first conductive pattern RDL1 are substantially leveled. The first conductive pattern RDL1 (i.e. the first UBM pattern UBM1) exposed by the first dielectric layer PM1 may be formed in a desired shape, such as a circular, oval, square, rectangular, or polygonal shape, although any desired shape may alternatively be formed.

The temporary carrier TC may be removed from the redistribution structure 100 by a thermal process, a mechanical peel-off process, a grinding process, an etching process, combinations of these, and may include additional cleaning process. In some embodiments, suitable energy source, e.g., UV light, UV laser, etc., is applied to weaken the bonds of the release layer RL, so that the temporary carrier TC may be separated from the remaining structure. Next, the resulting structure may be flipped over, and the conductive terminals 110 may be attached to the tape frame TP. The topmost dielectric layer (e.g., the seventh dielectric layer PM7) may face the tape frame TP. In some embodiments, the topmost dielectric layer (e.g., the seventh dielectric layer PM7) is in physical contact with the tape frame TP. Alternatively, the topmost dielectric layer (e.g., the seventh dielectric layer PM7) is spatially separated from the tape frame TP. In some embodiments, the step of attaching the structure to the tape frame TP is performed prior to the step of de-bonding the temporary carrier.

In some embodiments, the trenches TR1, TR2 and the pre-cut grooves PC1, PC2 face the tape frame TP. The trenches TR1, TR2 provide gas channels from the edge E of the redistribution layer 110 to the center region of the second side S2 of the redistribution layer 110 overlapping with the tape frame TP.

Figure 1E:
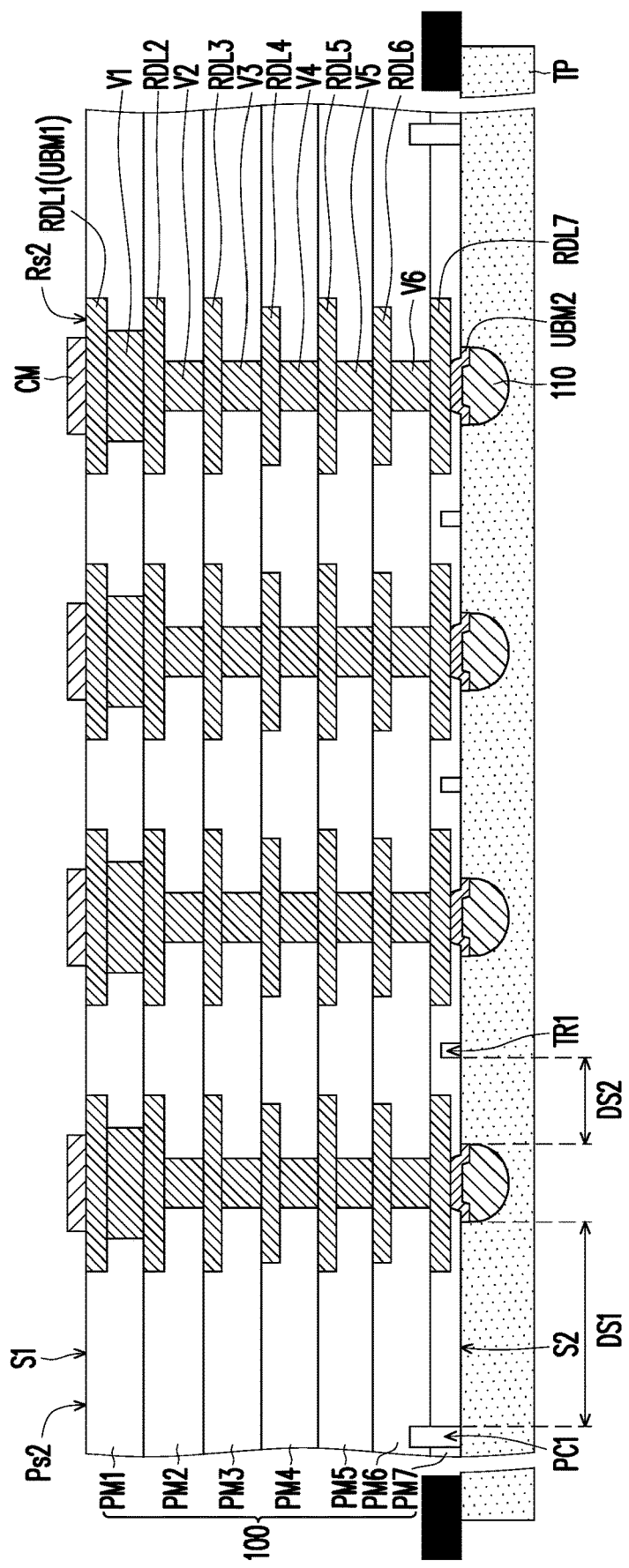
Figure 2E:
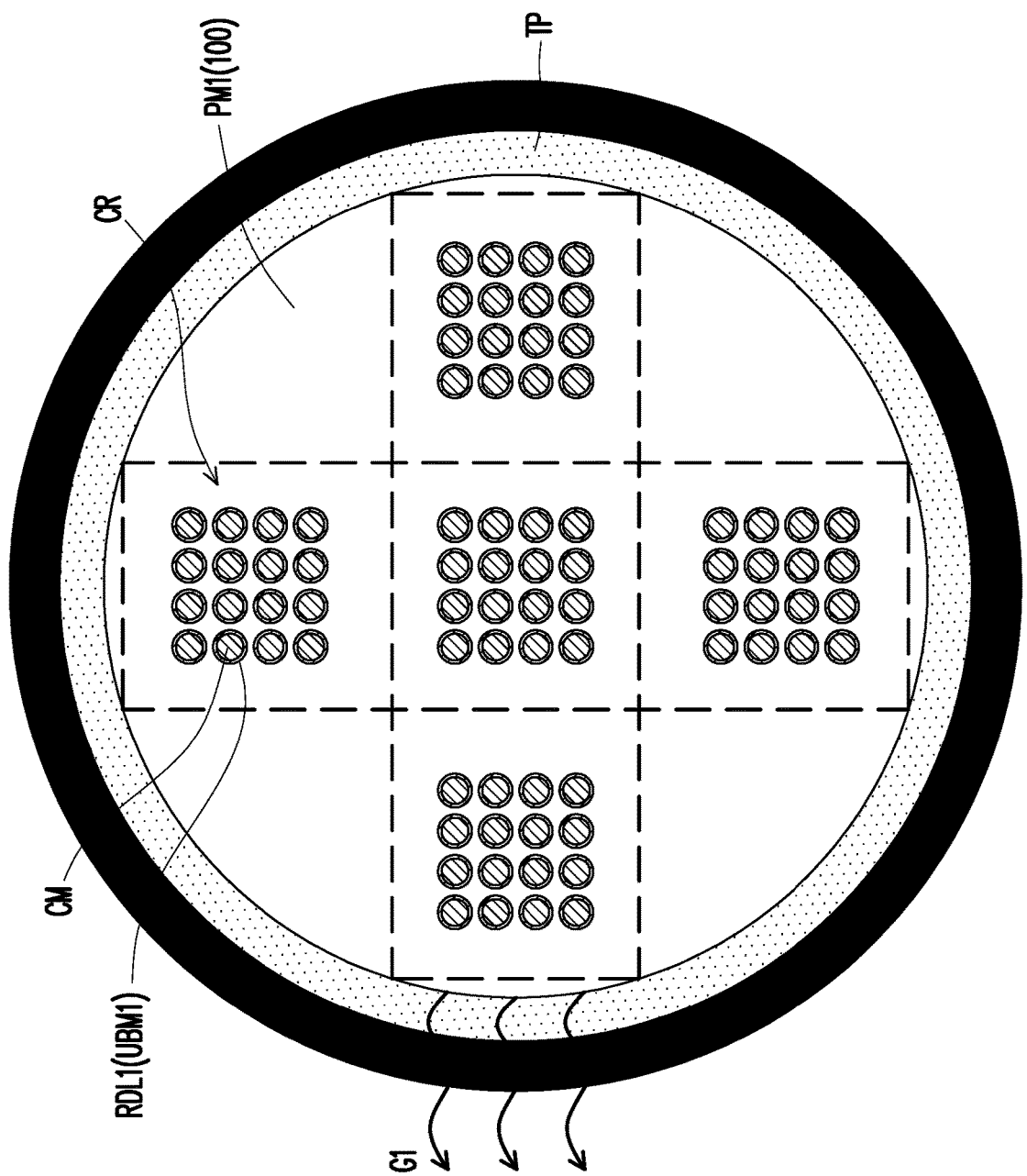

Referring to FIGS. 1E and 2E, a conductive material layer CM may be formed on the first conductive pattern RDL1 (i.e. the first UBM pattern UBM1) of the redistribution structure 100. In some embodiments, the conductive material layer CM is formed by printing, dispensing, or other suitable deposition techniques. For example, a stencil having apertures (not shown) is placed over the redistribution structure 100, where the apertures of the stencil may be aligned to the exposed surface Rs2 of the first conductive pattern RDL1. The apertures may be circular in shape, although through-holes in other stencils may have any shape, such as, oval, rectangular, and the like. After the stencil is placed, a conductive material may be then applied on the stencil and into the through holes of the stencil. In some embodiments, the conductive material is conductive paste including metal particles mixed with an adhesive. For example, the solder paste is utilized. Next, the stencil is removed, and the conductive material left on the exposed surface Rs2 of the first conductive pattern RDL1 forms the conductive material layer CM.

In some embodiments, the conductive material layer CM is solder flux applied to the first conductive pattern RDL1. The flux may serve primarily to aid the flow of the solder, such that the subsequently formed solder balls may make good contact with the first conductive pattern RDL1. The solder flux may be applied through brushing, spraying, printing, or the like. In some embodiments, the conductive material layer CM is formed on the first conductive pattern RDL1 (i.e. the first UBM pattern UBM1) within each of the circuit regions CR as shown in FIG. 2E. It is noted that the shape of the conductive material layer CM shown in FIGS. 1E and 2E is merely an example and construes no limitation in the disclosure.

After disposing the conductive material layer CM on the first conductive pattern RDL1, a pre-baking process may be performed to reduce moisture, thereby the delamination problem of a subsequent soldering process can be prevented. In some embodiments, gas G1 may be generated from the redistribution structure 100 and/or the tape frame TP during the pre-baking process. For example, organic materials in the redistribution structure 100 and/or the tape frame TP may release the gas G1 during the pre-baking process. The gas G1 is released through the trenches TR1, TR2 so that the gas G1 is not easy to accumulate between the redistribution structure 100 and the tape frame TP, thereby a dismount problem between the redistribution structure 100 and the tape frame TP can be prevented. In some embodiments, the gas G1 may include moisture, volatile gas, vaporized organic materials, or the like. In some embodiments, since the dismount problem is more likely to occur at the location of the conductive terminal 110, the trenches TR1, TR2 are designed to be adjacent to the conductive terminal 110 so as to better improve the dismount problem.

Figure 1F:
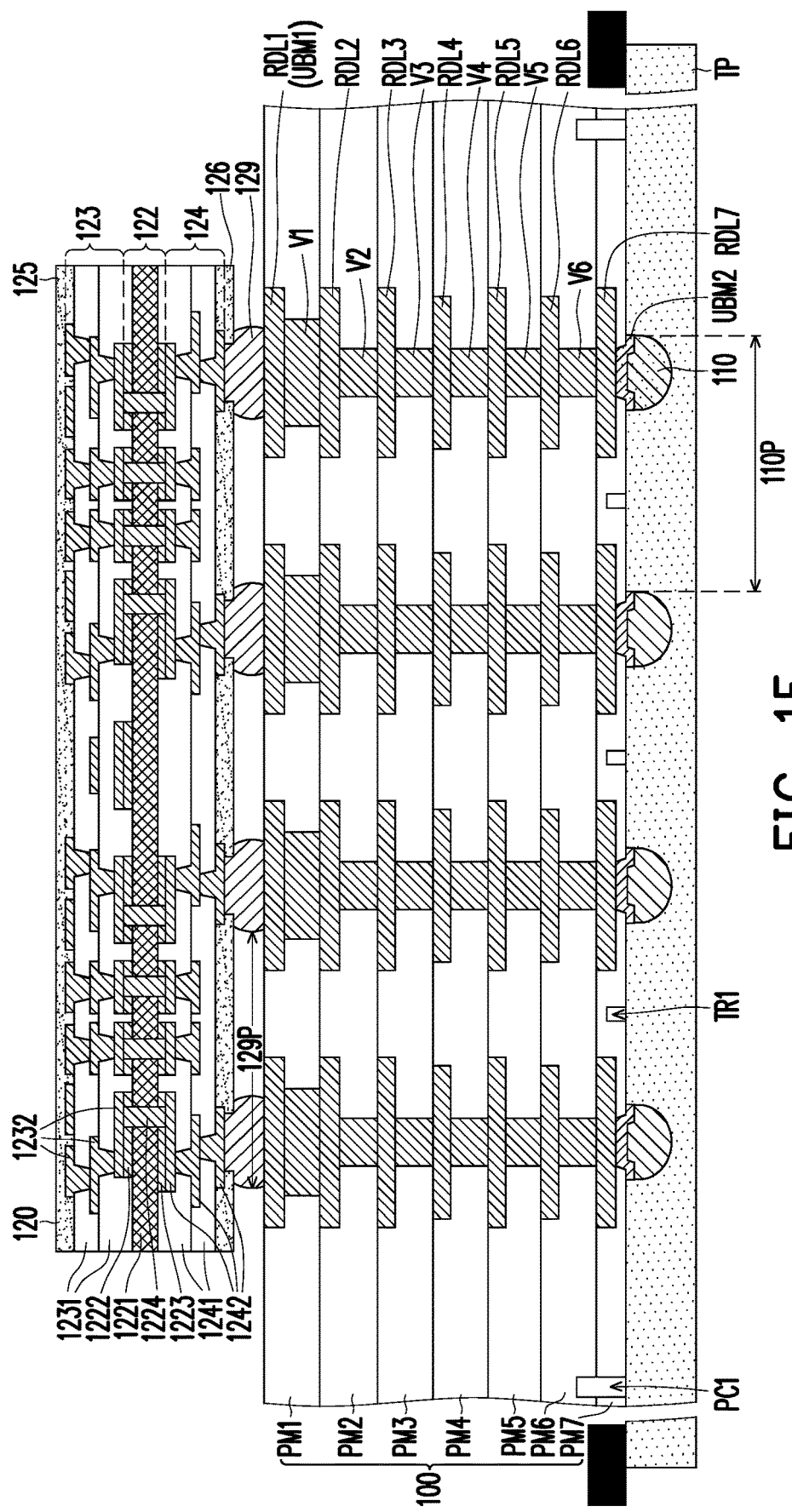
Figure 2F:
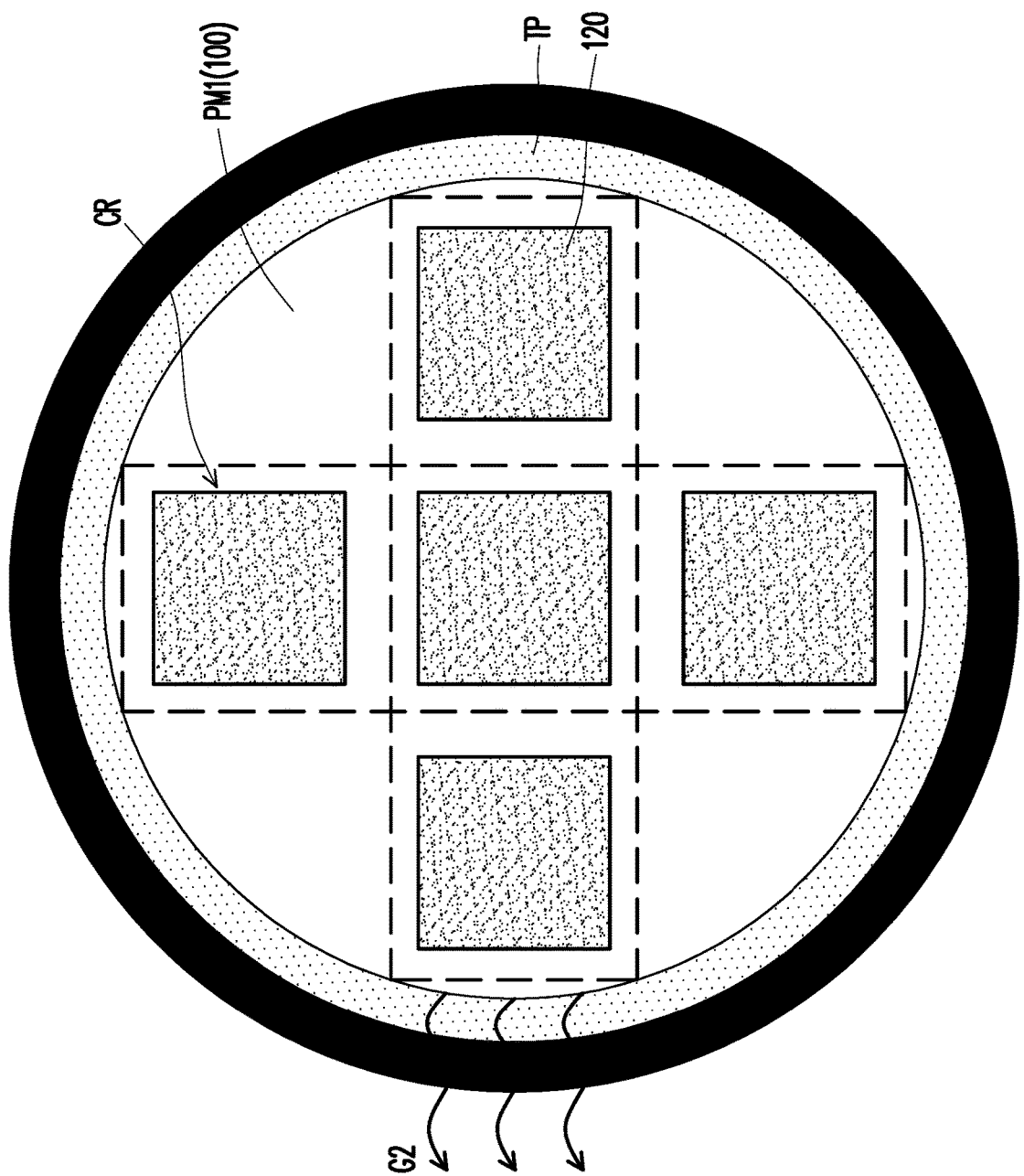

Referring to FIGS. 1F and 2F, circuit substrates 120 are disposed over and coupled to the redistribution structure 100. For example, the circuit substrates 120 are placed into contact with the conductive material layer CM on the first conductive pattern RDL1 (i.e. the first UBM pattern UBM1), and then a high temperature process, such as reflow or thermal compression bonding, may be performed to melt the conductive material layer CM on the first conductive pattern RDL1 and/or the solder connectors (not shown) on the circuit substrate 120. The melted solder layer may thus join the circuit substrates 120 and the redistribution structure 100 together. In some embodiments, reflowed regions formed by melting the solder layer are referred to as conductive joints 129. The conductive joints 129 may be referred to as solder joints in accordance with some embodiments. The conductive joints 129 are formed on the first side S1 of the redistribution structure 100 and in contact with the first conductive pattern RDL1. The circuit substrates 120 and the redistribution structure 100 are coupled through the conductive joints 129. In some embodiments, the critical dimension of adjacent conductive terminals 110 is less than the critical dimension of adjacent conductive joints 129. The pitch 129P of adjacent conductive terminals 110 is less than the pitch 129P of adjacent conductive joints 129. For example, the pitch 129P of the adjacent conductive joints 129 ranges from about 100 μm to about 1000 μm.

In some embodiments, gas G2 may be generated from the redistribution structure 100 and/or the tape frame TP during heating the conductive material layer CM to form the conductive joints 129. For example, organic materials in the redistribution structure 100 and/or the tape frame TP may release the gas G2 during the heating process. The gas G2 is released through the trenches TR1, TR2 so as to prevent a dismount problem between the redistribution structure 100 and the tape frame TP. In some embodiments, the gas G2 may include moisture, volatile gas, vaporized organic materials, or the like. In some embodiments, the gas G2 includes materials similar to or different from the gas G1.

At least one of the circuit substrate 120 is arranged within the respective circuit region CR as shown in FIG. 2F. In some embodiments, multiple circuit substrates 120 are disposed within the respective circuit region CR. It is noted that the size and the number of the circuit substrate 120 may be adjusted depending on product requirements and should construe no limitation in the disclosure. In some embodiments, the respective circuit substrate 120 includes a core layer 122, a first build-up layer 123 and a second build-up layer 124 disposed on two opposing sides of the core layer 122. In some embodiments, the core layer 122 includes a core dielectric layer 1221, a first core conductive layer 1222 and a second core conductive layer 1223 disposed on two opposing sides of the core dielectric layer 1221. The core dielectric layer 1221 may be or may include prepreg (e.g., containing epoxy, resin, and/or glass fiber), PI, a combination thereof, or the like. However, other dielectric materials may also be used. The materials of the first core conductive layer 1222 and the second core conductive layer 1223 may include copper, gold, tungsten, aluminum, silver, gold, a combination thereof, or the like. In some embodiments, the first core conductive layer 1222 and the second core conductive layer 1223 are copper foils coated or plated on the opposite sides of the core dielectric layer 1222. In some embodiments, a plurality of conductive through holes 1224 penetrating through the core layer 122 provide electrical paths between the electrical circuits located on the opposite sides of the core layer 122. The first build-up layer 1231 may be physically and electrically connected to the second build-up layer 1232 through the conductive through holes 1224.

In some embodiments, the first build-up layer 123 includes a plurality of first dielectric layers 1231 and a plurality of first conductive patterns 1232 alternately stacked over the first side of the core layer 122. The second build-up layer 124 may include a plurality of second dielectric layers 1241 and a plurality of second conductive patterns 1242 alternately stacked over the second side of the core layer 122. The via portions of the first conductive patterns 1232 and the via portions of the second conductive patterns 1242 may be tapered toward the core layer 122. Although only two layers of conductive patterns and two layers of dielectric layers are illustrated for each of the first build-up layer 123 and the second build-up layer 124, the scope of the disclosure is not limited thereto. The materials of the first and second dielectric layers 1231 and 1241 may be or may include prepreg, PI, PBO, BCB, silicon nitride, silicon oxide, phosphosilicate glass (PSG), borosilicate glass (BSG), boron-doped phosphosilicate glass (BPSG), a combination thereof, or the like. In some embodiments, the materials of the first and second conductive patterns 1232 and 1242 may be or may include metal, such as aluminum, titanium, copper, nickel, tungsten, and/or alloys thereof.

In some embodiments, the circuit substrate 120 includes a first mask layer 125 disposed on the outermost one of the first dielectric layer 1231 to cover the first conductive patterns 1232, and a second mask layer 126 disposed on the outermost one of the second dielectric layer 1241 to cover the second conductive patterns 1242. The second mask layer 126 may include a plurality of openings that partially expose the outermost one of the second conductive pattern 1242. In some embodiments, the first mask layer 125 may also include openings (not shown) that partially expose the outermost one of the first conductive pattern 1232 for further electrical connection. In some embodiments, the materials of the first and second mask layers 125 and 126 may be or may include a chemical composition of silica, barium sulfate and epoxy resin, and/or the like. The first and second mask layers 125 and 126 may serve as solder masks and may be selected to prevent short, corrosion or contamination of the circuit pattern and protect circuits of the circuit substrate 120 from external impacts and chemicals. In some embodiments, the conductive joints 129 are disposed in the openings of the second mask layer 126 to be in physical and electrical contact with the second conductive pattern 1242. Alternatively, the first mask layer 125 and/or the second mask layer 126 may be omitted.

In some embodiments, the circuit substrate 120 may be or may include a printed circuit board (PCB) such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may also be utilized, and all such redistributive substrates that provide support and connectivity to the redistribution structure 100 are fully intended to be included within the scope of the embodiments.

Figure 1G:
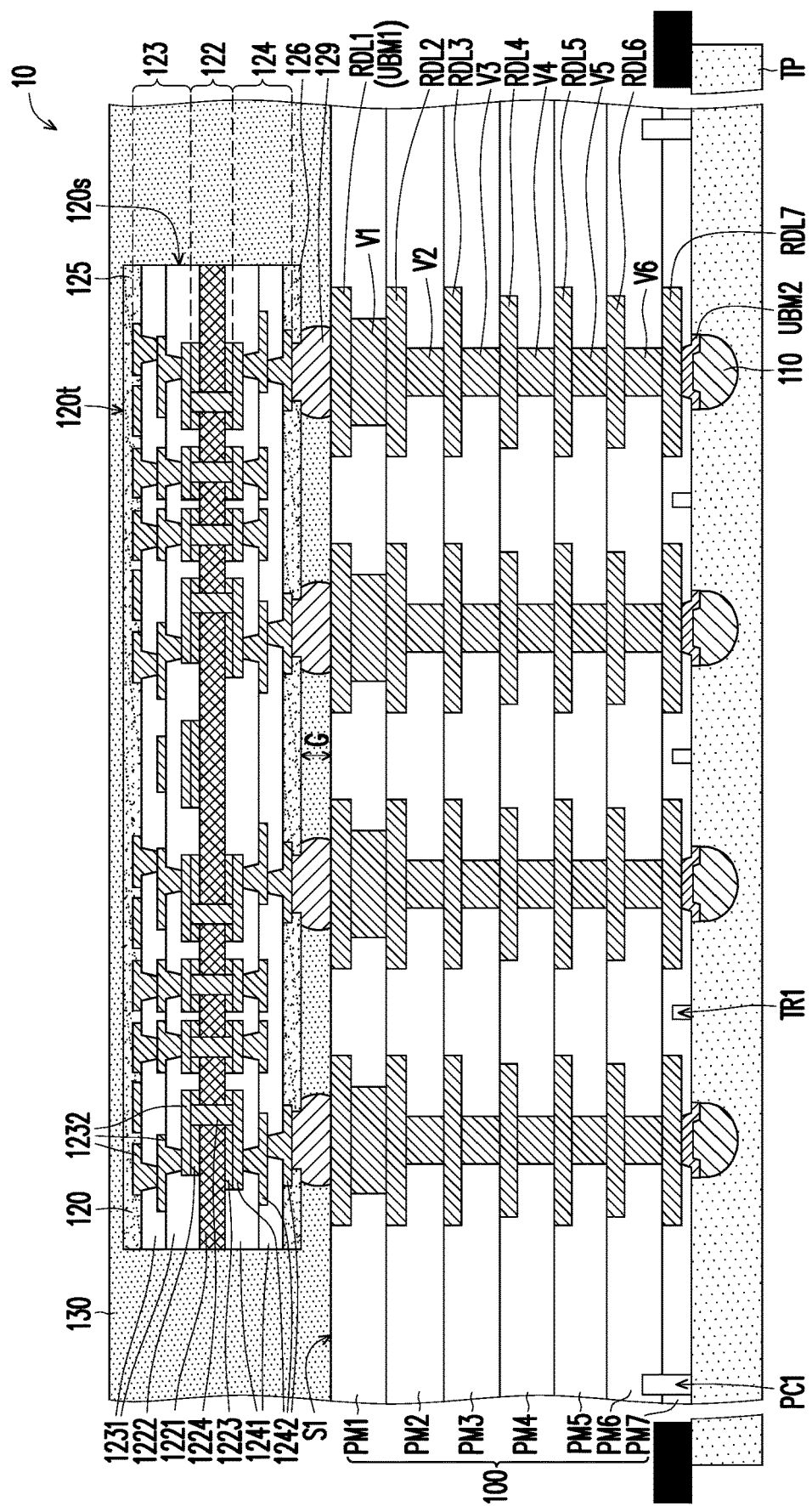
Figure 2G:
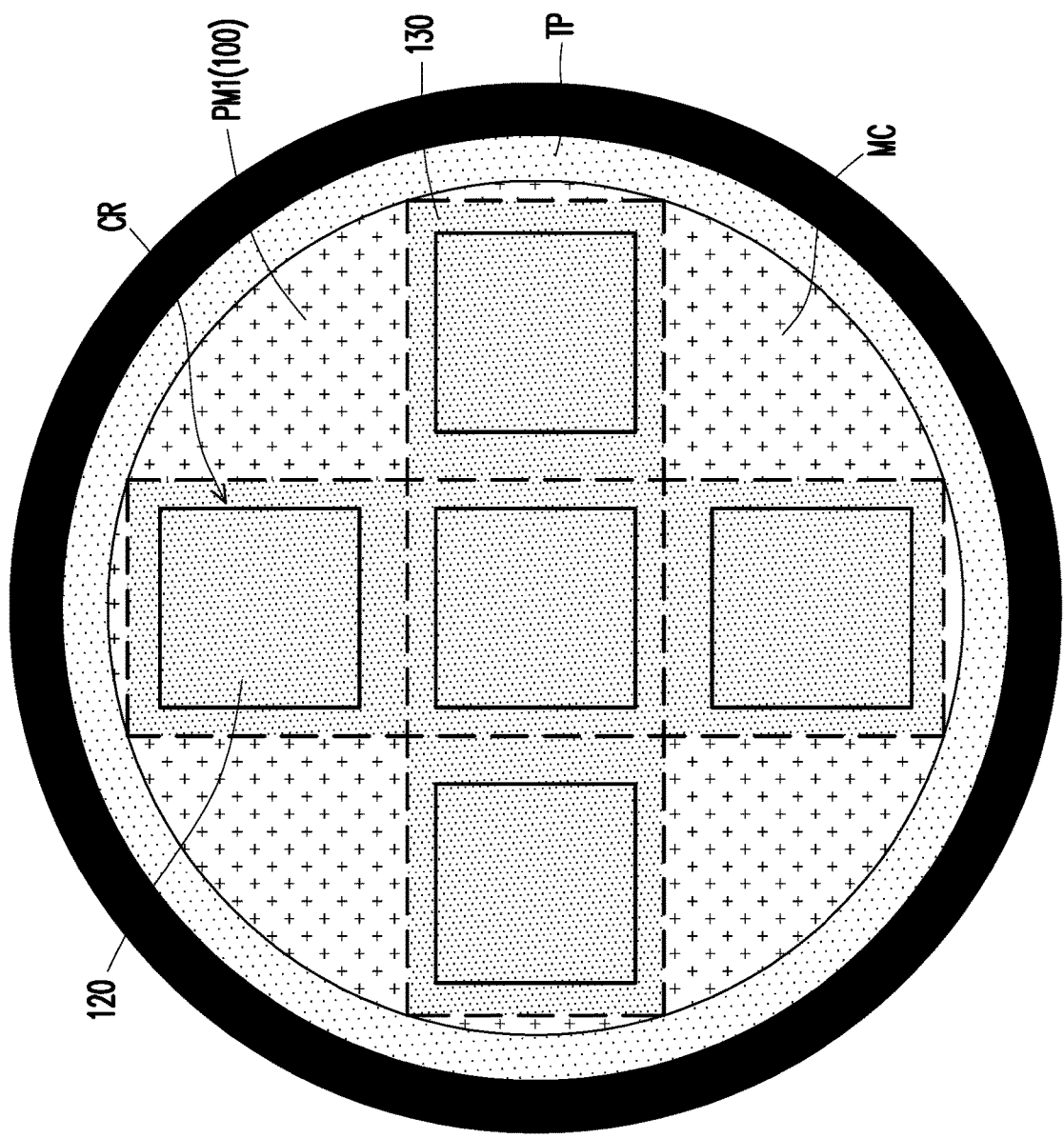

Referring to FIGS. 1G and 2G, a flowable encapsulation material 130 is applied onto the first side S1 of the redistribution structure 100 to cover the circuit substrate 120. In some embodiments, the flowable insulating encapsulation 130 covers the sidewalls 120s and the top surfaces 120t of the circuit substrate 120, but the disclosure is not limited thereto. In other embodiments, the flowable insulating encapsulation 130 may partially cover the sidewalls 120s of the circuit substrate 120 and not cover the top surfaces 120t of the circuit substrate 120.

The flowable encapsulation material 130 may flow into the space G between the redistribution structure 100 and the circuit substrate 120. In some embodiment, additional guiding patterns (not shown) are formed on the redistribution structure 100, and the flowable encapsulation material 130 may flow into the space G through guidance of the guiding patterns. The material of the flowable encapsulation material 130 may be or may include a molding compound, an epoxy, a resin, a dispensed molding underfill (DMUF), or a combination thereof, or the like. The flowable encapsulation material 130 may be dispensed using such as a molding process (e.g., a transfer molding process), an injection process, a combination thereof, or the like. In some embodiments, a molding chase MC may be disposed over blank areas of the redistribution structure 100, wherein no circuit region CR is arranged in the blank areas. The circuit substrates 120 are accommodated in the space defined by the molding chase MC, then the flowable encapsulation material 130 may be injected into the space of the molding chase MC and spread to mold the circuit substrates 120 and the conductive joints 129. Alternatively, in other embodiments, the blank areas are not covered by the molding chase MC, and the flowable encapsulation material 130 covers the circuit substrates 120 and also spreads in the blank areas.

Figure 1H:
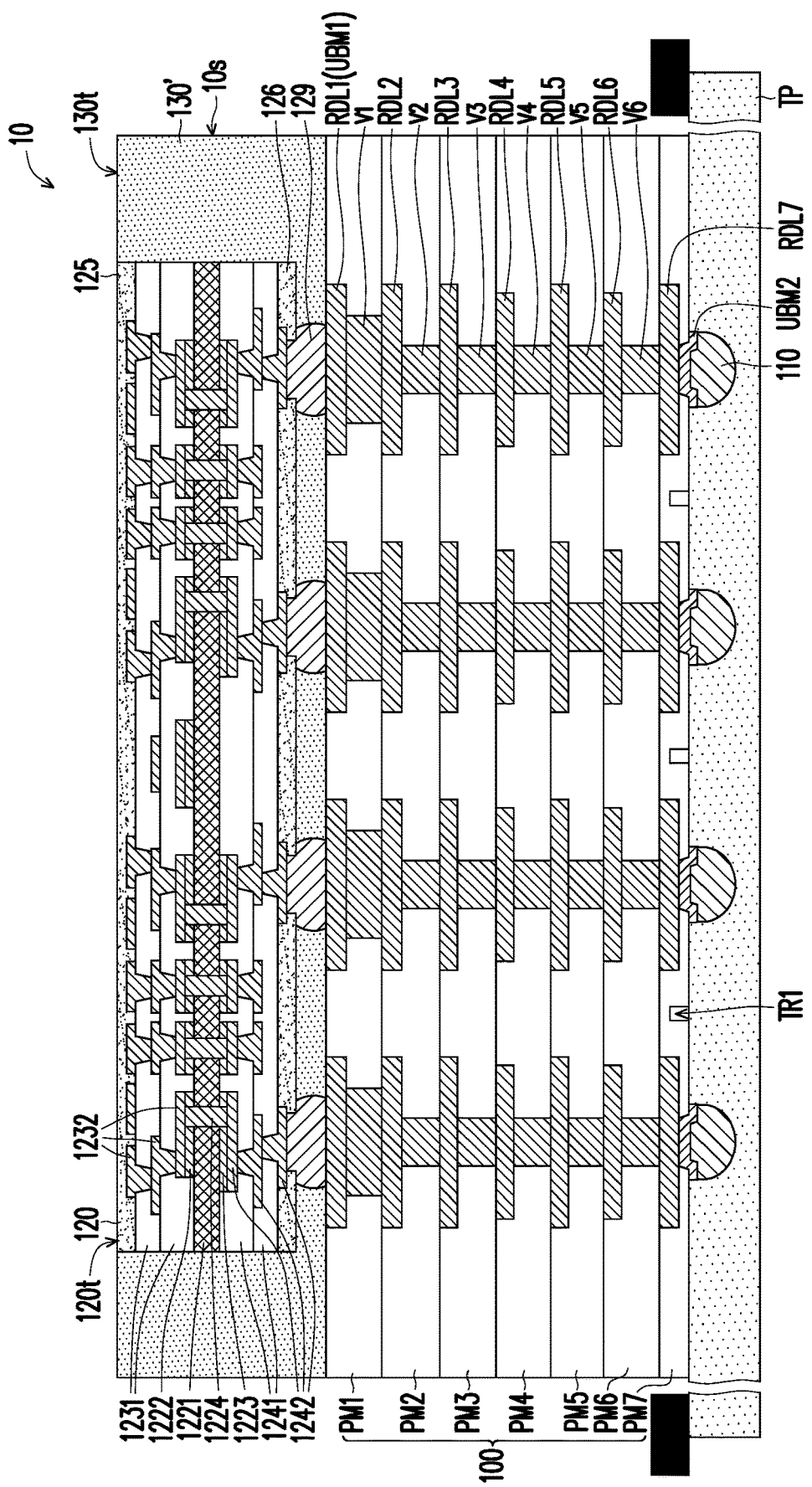
Figure 2H:
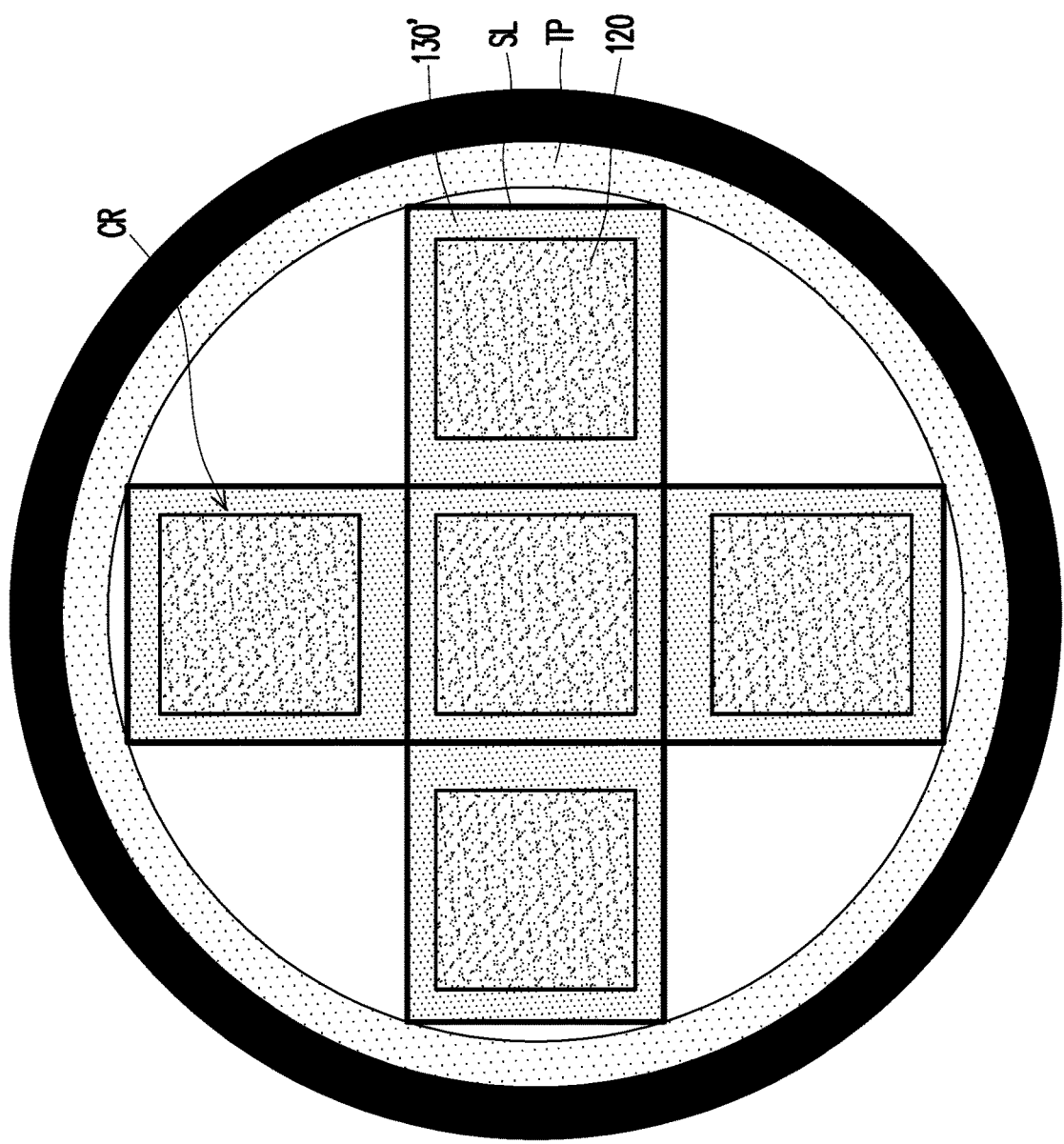

Referring to FIGS. 1H and 2H and also with reference to FIG. 2G, the flowable encapsulation material 130 may be cured such that a cured insulating encapsulation is formed on the redistribution structure 100 to laterally encapsulate the circuit substrate 120 and the conductive joints 129. After the curing, the molding chase MC may be removed, and the cured insulating encapsulation is formed on the redistribution structure 100 to encapsulate the circuit substrates 120 and the conductive joints 129. In some embodiments, a planarization process (e.g., CMP, grinding, etching, combinations of these, etc.) is performed to level the cured insulating encapsulation and the circuit substrates 120. The top surface 130t of the cured insulating encapsulation is substantially leveled with the top surfaces 120t of the circuit substrates 120. In other embodiments, the planarization process is omitted. The top surfaces 120t of the circuit substrates 120 may not be covered by the flowable encapsulation material 130, so that the cured insulating encapsulation exposes the top surfaces 120t of the circuit substrates 120 without the planarization process.

A singulation process is performed to singulate the encapsulated structure into a plurality of semiconductor structures 10. The singulation process may be performed, by a mechanical sawing process, a laser cutting process, a laser micro-jet cutting process, or the like, to cut through and/or remove materials of the cured insulating encapsulation and the the redistribution structure 100, such that an insulating encapsulation 130' and a redistribution structure 100' are formed. The dicing tool may cut along the cutting lines SL to separate the circuit regions CR so as to form the semiconductor structures 10. The cutting lines SL are overlapping with the pre-cut grooves PC1, PC2, thereby preventing the delamination of the redistribution structure 100' during the singulation process. In other words, the singulation process is performed on the redistribution structure 100 and the cured insulating encapsulation along the pre-cut grooves CR1, CR2. In some embodiments, the cured insulating encapsulation and the underlying redistribution structure 100' are cut through to form substantially coterminous sidewalls 10s of the semiconductor structure 10.

Figure 1I:
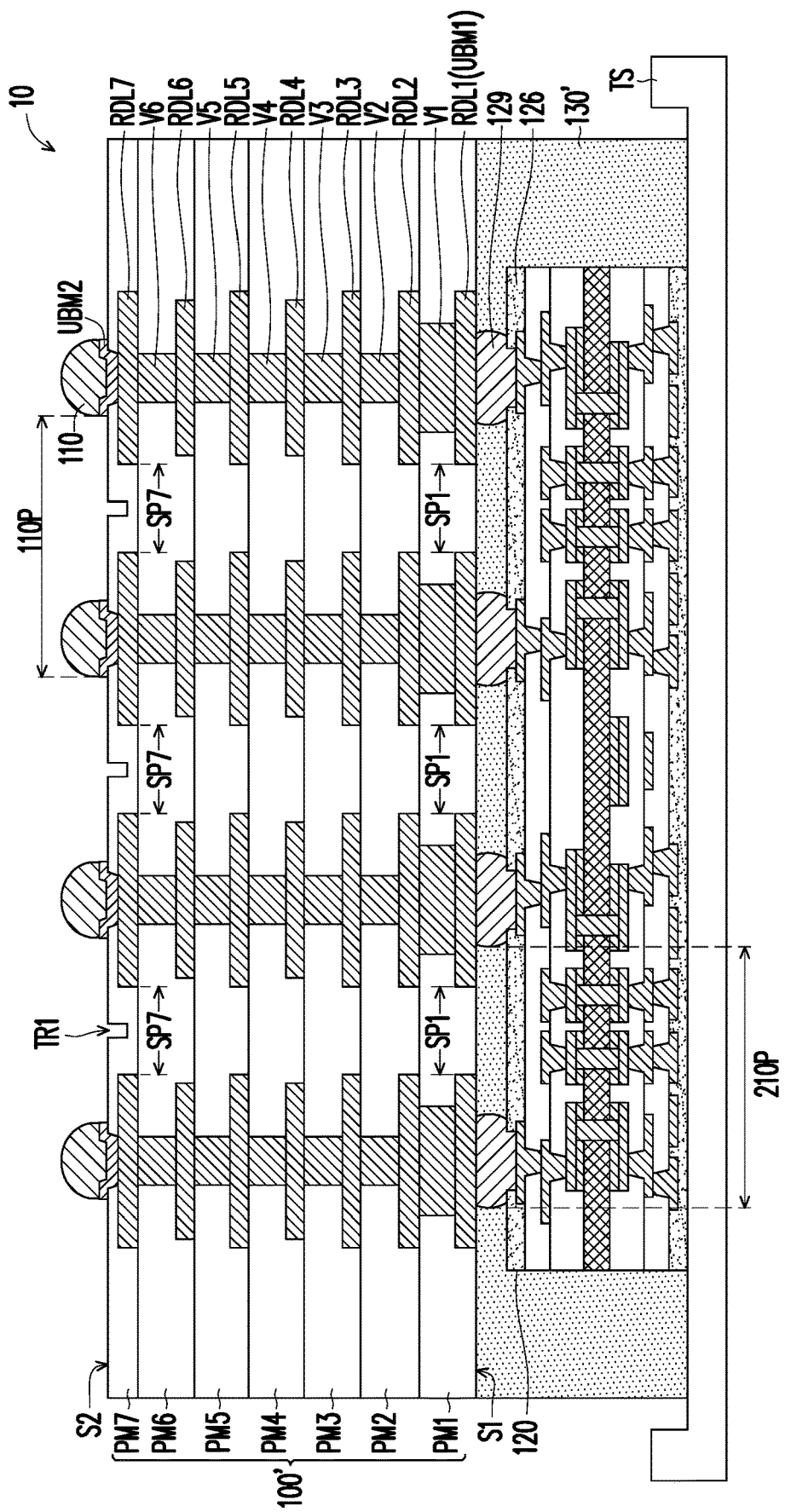
Figure 2I:
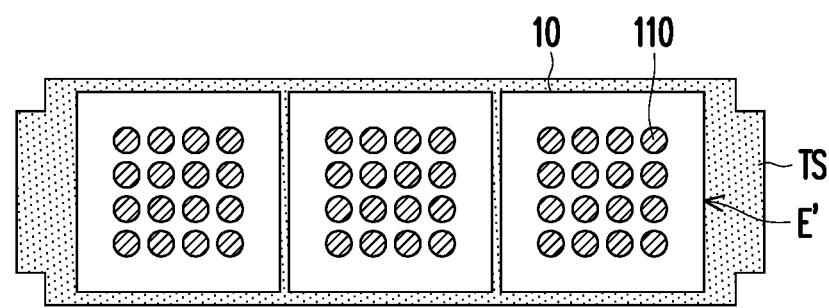

Referring to FIGS. 1I and 2I and also with reference to FIG. 1H, after the singulation process, the semiconductor structures 10 are separated from the tape frame TP and then placed on a tray cassette TS. The semiconductor structures 10 on the tray cassette TS may await to transfer to the next station or may ship to customers. As shown in FIG. 1I, the respective semiconductor structure 10 includes the redistribution structure 100', the circuit substrate 120 disposed on a first side S1 of the redistribution structure 100', the conductive terminals 110 distributed on a second side S2 of the redistribution structure 100' opposite to the first side S1, the insulating encapsulation 130' disposed on the first side S1 of the redistribution structure 100' to at least laterally cover the circuit substrate 120. The circuit substrate 120 is electrically connected to the redistribution structure 100' through the conductive joints 129, and the conductive joints 129 are formed on the first conductive pattern RDL1 (i.e. the first UBM pattern UBM1). The conductive terminals 110 may be electrically coupled to the circuit substrate 120 through the redistribution structure 100'.

In some embodiments, trenches TR1, TR2 are located on the second side S2 of the redistribution structure 100' and extend to an edge E' of the semiconductor structure 10. In some embodiments, since the gas G1 and the gas G2 (see FIG. 1E to FIG. 2F) generated during heating process can release through the trenches TR1, TR2, the dismount problem between the redistribution structure 100' and the tape frame TP can be prevented.

Figure 3A:
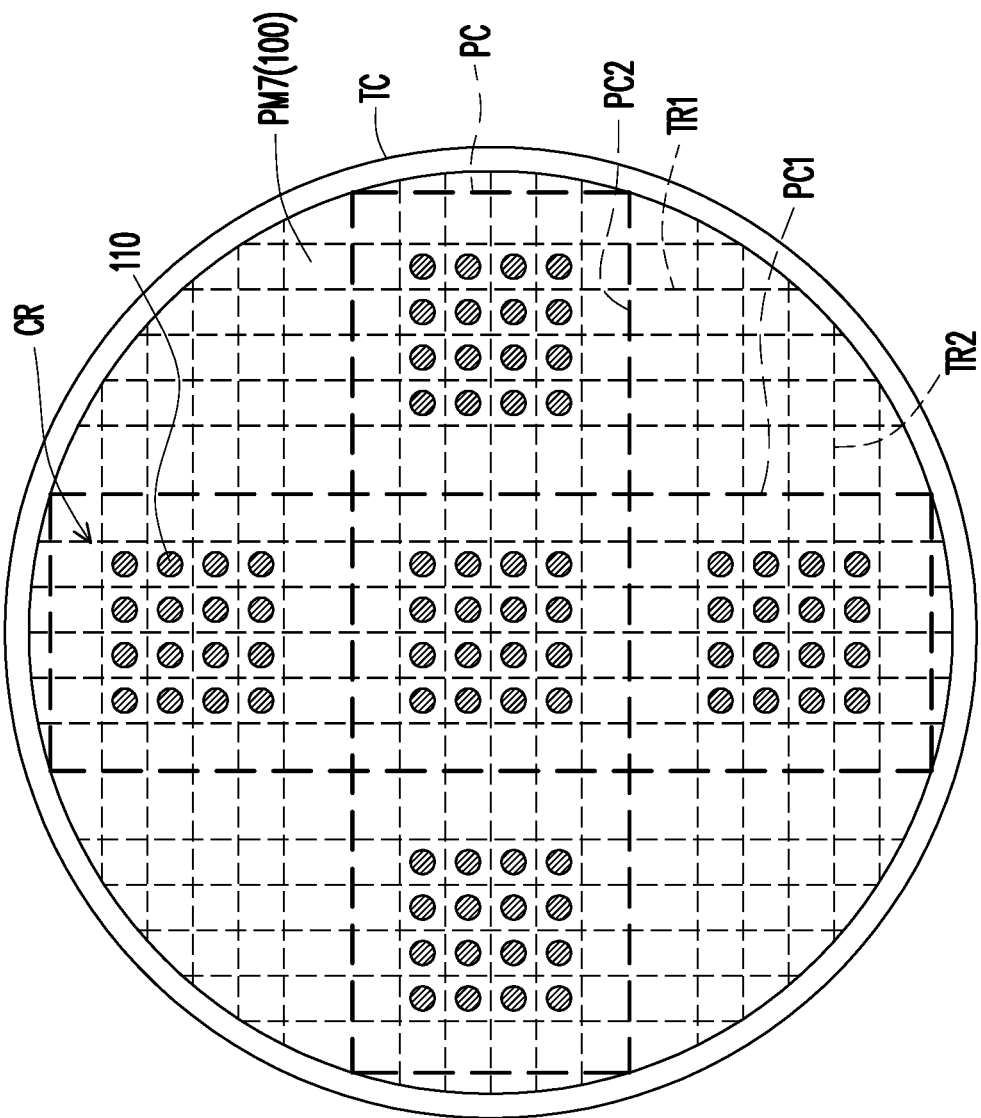
FIG. 3A is a schematic top view of a redistribution structure in accordance with some embodiments.
Figure 3B:
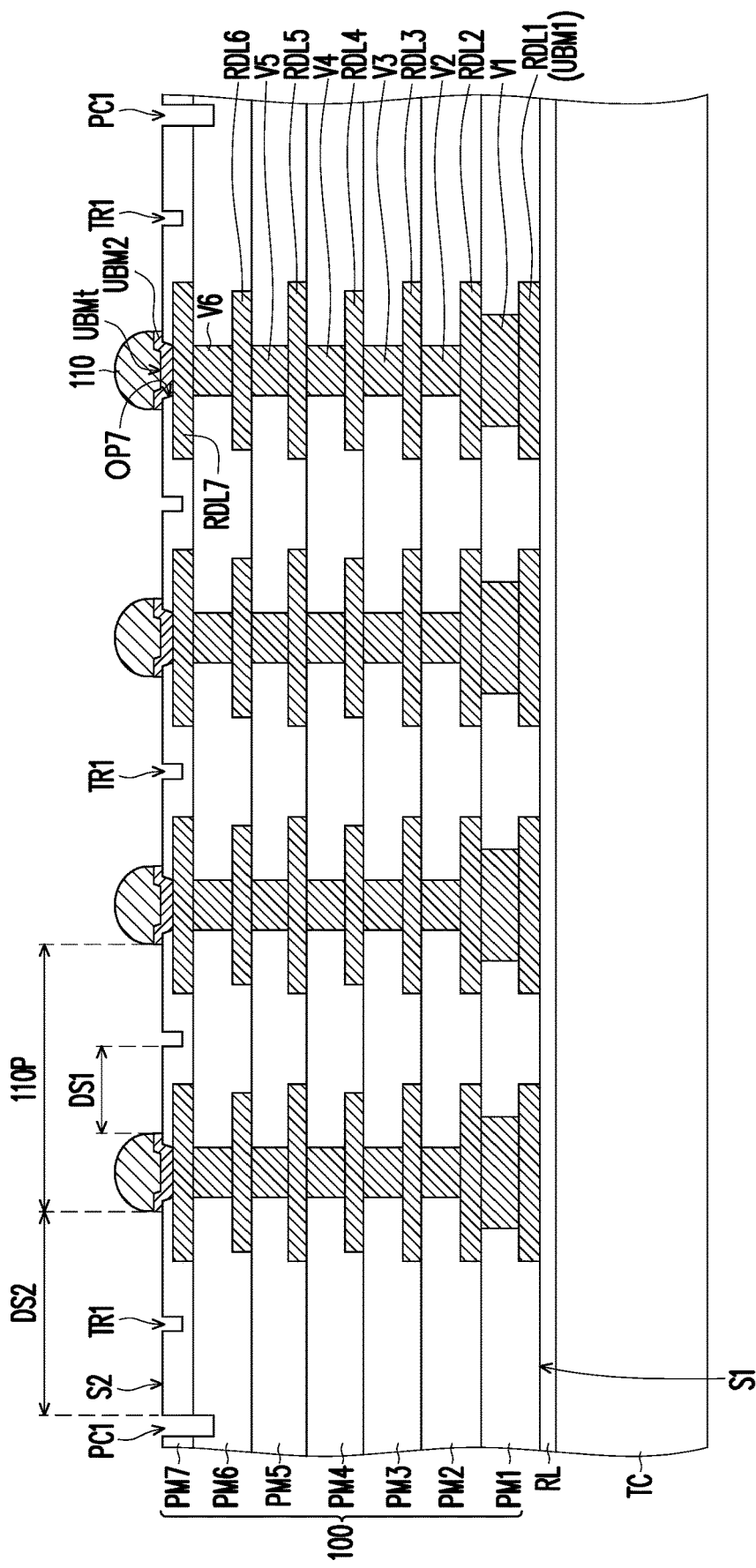
FIG. 3B is a schematic cross-section view corresponding to FIG. 3A in accordance with some embodiments.

FIG. 3A is a schematic top view of a redistribution structure in accordance with some embodiments. FIG. 3B is a schematic cross-section view corresponding to FIG. 3A in accordance with some embodiments. Unless specified otherwise, the materials and the formation methods of the components described herein are essentially the same as the like components, which are denoted by like reference numerals shown in FIGS. 1A-2I.

Referring to FIGS. 3A and 3B, in this embodiment, the trenches TR1 are also formed between the pre-cut grooves CR1 and the conductive terminals 110. Similarly, the trenches TR2 are also formed between the pre-cut grooves CR2 and the conductive terminals 110.

After providing the structure shown in FIGS. 3A and 3B, processes described in FIGS. 1D-2I are proceed to manufacture the singulated semiconductor structures.

In this embodiments, trenches TR1, TR2 are used to release gas generated during heating processes, so as to prevent the dismount problem between the redistribution structure and the tape frame.

Figure 4:
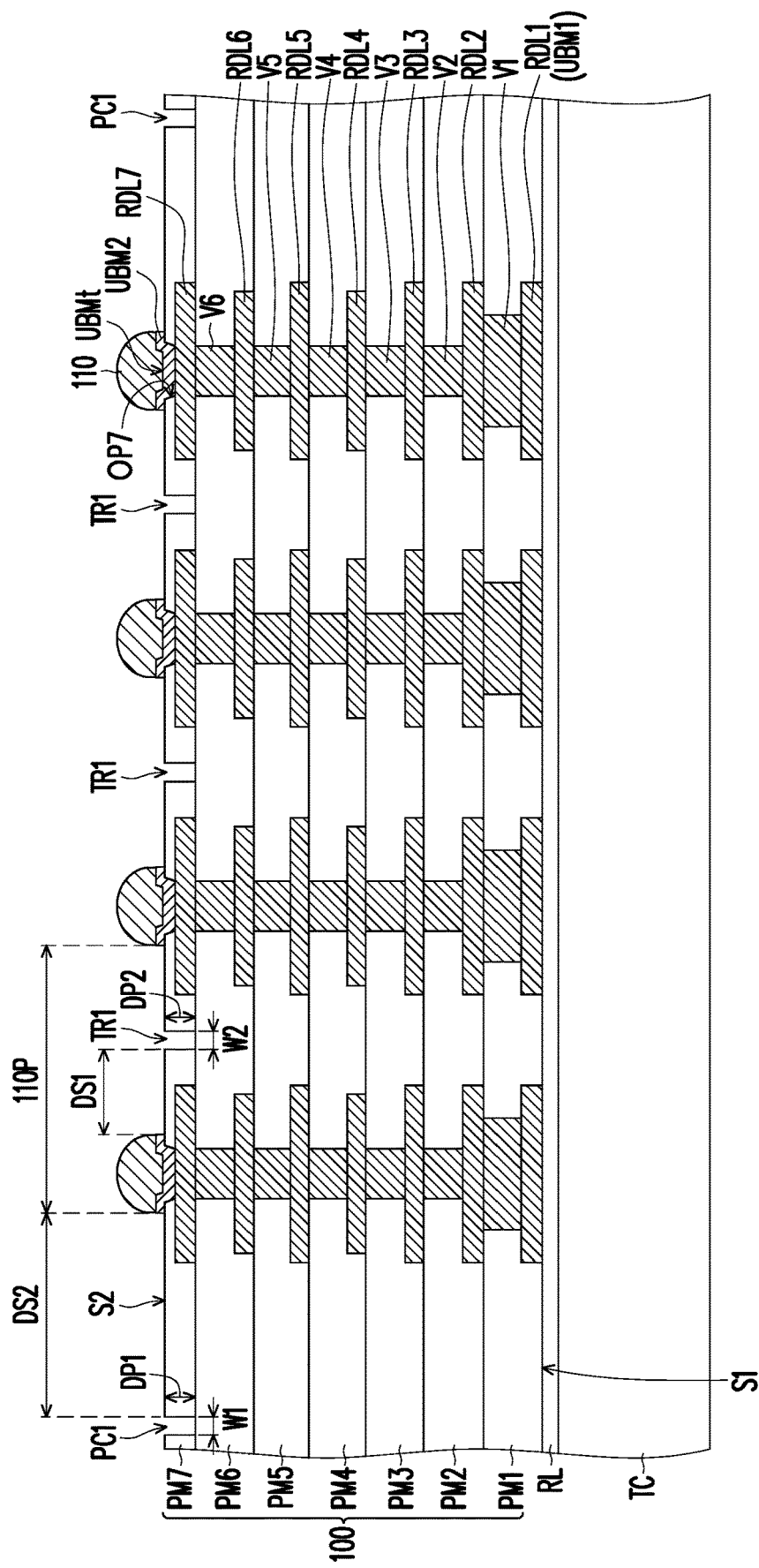
FIG. 4 is a schematic cross-section view of a redistribution structure in accordance with some embodiments.

FIG. 4 is a schematic cross-section view of a redistribution structure in accordance with some embodiments. Unless specified otherwise, the materials and the formation methods of the components described herein are essentially the same as the like components, which are denoted by like reference numerals shown in FIGS. 1A-2I.

Referring to FIG. 4, in this embodiment, a width W1 of each of the pre-cut grooves PC1 (PC2) is substantially equal to a width W2 of each of the trenches TR1 (TR2), and a depth DP1 of each of the pre-cut grooves PC1 (PC2) is substantially equal to a depth DP2 of each of the trenches TR1 (TR2). In this embodiment, the pre-cut grooves PC1 (PC2) and the trenches TR1 (TR2) may be formed by the same cutting process.

After providing the structure shown in FIGS. 4, processes described in FIGS. 1D-2I are proceed to manufacture the singulated semiconductor structures.

In this embodiments, trenches TR1, TR2 are used to release gas generated during heating processes, so as to prevent the dismount problem between the redistribution structure and the tape frame.

Figure 5:
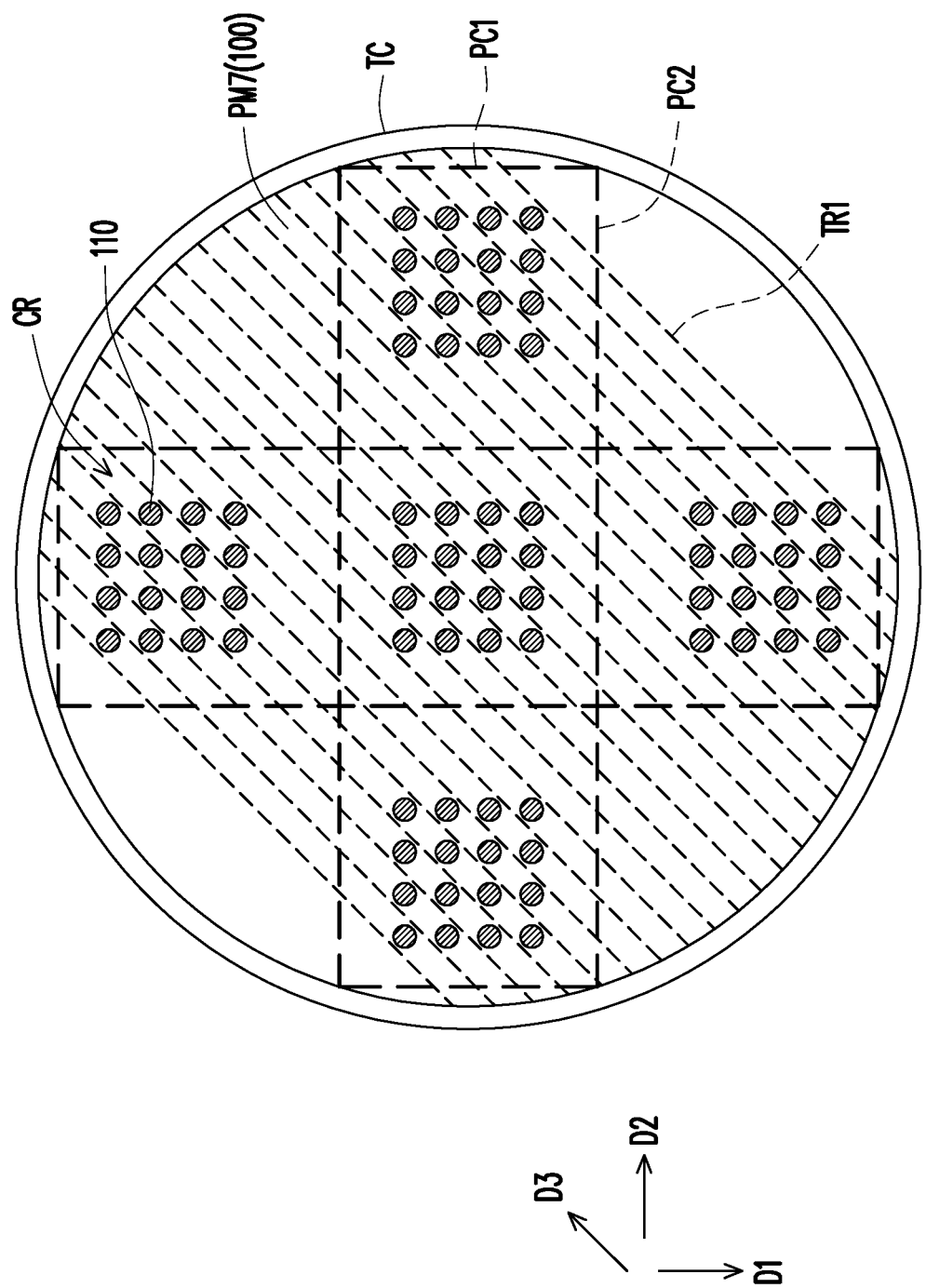
FIG. 5 is a schematic top view of a redistribution structure in accordance with some embodiments.

FIG. 5 is a schematic top view of a redistribution structure in accordance with some embodiments. Unless specified otherwise, the materials and the formation methods of the components described herein are essentially the same as the like components, which are denoted by like reference numerals shown in FIGS. 1A-2I.

Referring to FIG. 5, in this embodiment, the pre-cut grooves PC1 are extending along the first direction D1 which is angled with the extending direction (e.g., a second direction D2) of the pre-cut grooves PC2. In some embodiments, the first direction D1 is perpendicular to the second direction D2, but the disclosure is not limited thereto.

The trenches TR1 are extending along a third direction D3 which is angled with the extending direction (e.g., the first direction D1) of the pre-cut grooves PC1 and the extending direction (e.g., the second direction D2) of the pre-cut grooves PC2. In this embodiment, all of the trenches TR1 are extending along the same extending direction (e.g., the third direction D3).

After providing the structure shown in FIGS. 5, processes described in FIGS. 1D-2I are proceed to manufacture the singulated semiconductor structures.

In this embodiments, trenches TR1 are used to release gas generated during heating processes, so as to prevent the dismount problem between the redistribution structure and the tape frame.

Figure 6:
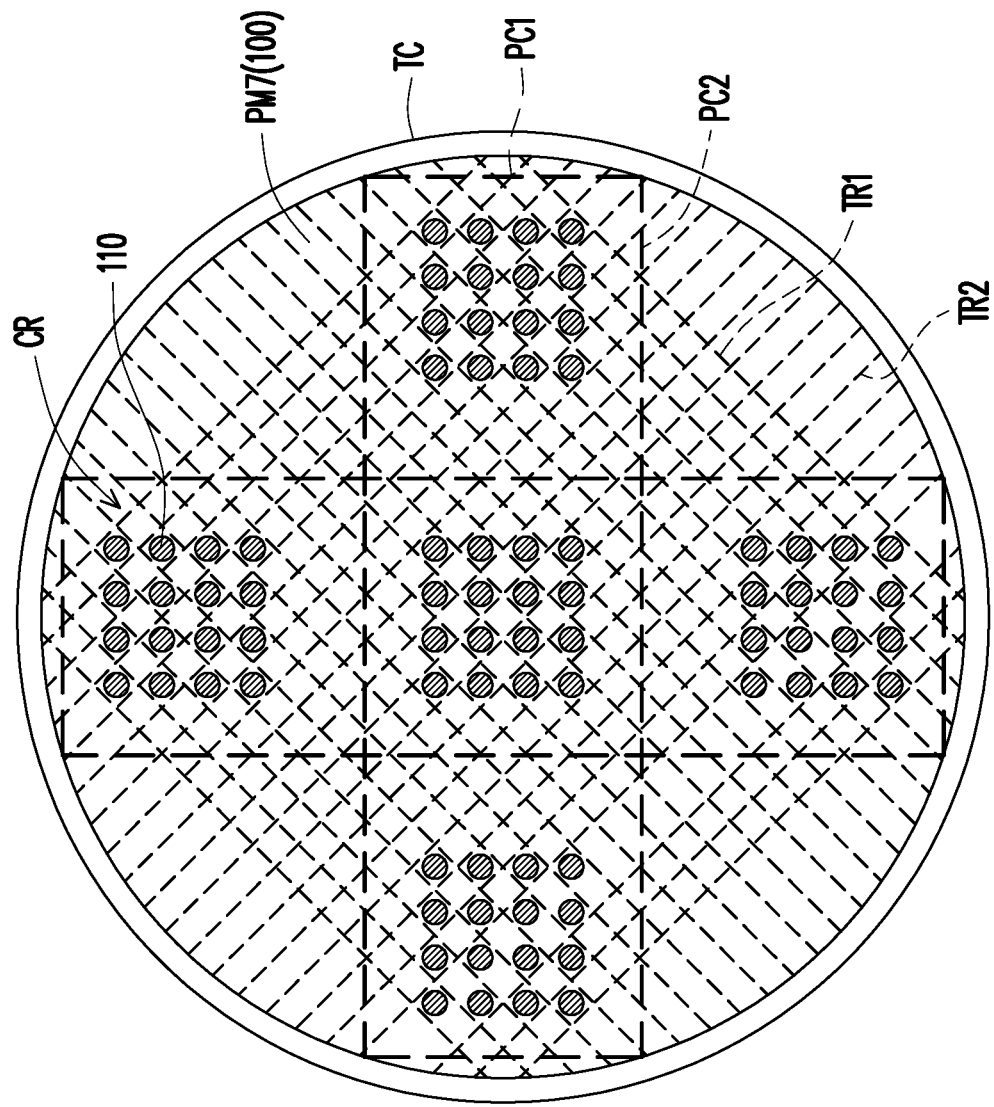
FIG. 6 is a schematic top view of a redistribution structure in accordance with some embodiments.
Figure 6:
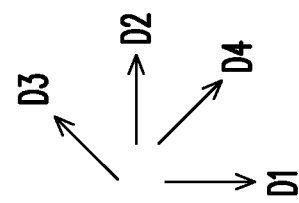

FIG. 6 is a schematic top view of a redistribution structure in accordance with some embodiments. Unless specified otherwise, the materials and the formation methods of the components described herein are essentially the same as the like components, which are denoted by like reference numerals shown in FIGS. 1A-2I.

Referring to FIG. 6, in this embodiment, the pre-cut grooves PC1 are extending along the first direction D1 which is angled with the extending direction (e.g., a second direction D2) of the pre-cut grooves PC2. In some embodiments, the first direction D1 is perpendicular to the second direction D2, but the disclosure is not limited thereto.

The trenches TR1 and the trenches TR2 are extending along different directions. The trenches TR1 are extending along a third direction D3 which is angled with the extending direction (e.g., the first direction D1) of the pre-cut grooves PC1 and the extending direction (e.g., the second direction D2) of the pre-cut grooves PC2. The trenches TR2 are extending along a fourth direction D4 which is angled with the extending direction (e.g., the first direction D1) of the pre-cut grooves PC1 and the extending direction (e.g., the second direction D2) of the pre-cut grooves PC2. The third direction D3 is not parallel with the fourth direction D4.

After providing the structure shown in FIGS. 6, processes described in FIGS. 1D-2I are proceed to manufacture the singulated semiconductor structures.

In this embodiments, trenches TR1, TR2 are used to release gas generated during heating processes, so as to prevent the dismount problem between the redistribution structure and the tape frame.

In accordance with some embodiments of the disclosure, a semiconductor structure includes a redistribution structure, conductive joints, conductive terminals, a circuit substrate, and an insulating encapsulation. The redistribution structure includes a first side and a second side opposite to the first side, wherein trenches are located on the second side of the redistribution structure and extend to an edge of the second side of the redistribution structure. The conductive joints are disposed over the first side of the redistribution structure. The conductive terminals are disposed over the second side of the redistribution structure. The circuit substrate electrically coupled to the redistribution structure through the conductive joints. The insulating encapsulation is disposed on the first side of the redistribution structure to cover the circuit substrate.

In accordance with some other embodiments of the disclosure, a manufacturing method of a semiconductor structure including the followings is provided. A redistribution structure having a first side and a second side opposite to the first side is formed. Trenches and pre-cut grooves are formed on the second side of the redistribution structure. Conductive terminals are formed on the second side of the redistribution structure. Conductive joints are formed on the first side of the redistribution structure. Circuit substrates are coupled to the redistribution structure through the conductive joints. An insulating encapsulation is formed on the redistribution structure to cover the circuit substrates. A singulation process is performed on the redistribution structure and the insulating encapsulation along the pre-cut grooves.

In accordance with some other embodiments of the disclosure, a manufacturing method of a semiconductor structure including the followings is provided. A redistribution structure is formed on a temporary carrier, wherein the redistribution structure having a first side facing the temporary carrier and a second side opposite to the first side. Trenches are formed on the second side of the redistribution structure on the temporary carrier. Circuit substrates are coupled to the first side of the redistribution structure, wherein at least one of the circuit substrates is disposed within circuit regions of the redistribution structure. A conductive material layer between the circuit substrates and the redistribution structure is heated. A gas is released through the trenches. An insulating encapsulation is formed on the first side of the redistribution structure to cover the circuit substrates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising: a redistribution structure comprising a bottom surface, a top surface opposite to the bottom surface, and a sidewall located between the top surface and the bottom surface, wherein gas release trenches are extending along the top surface of the redistribution structure and extend to the sidewall of the redistribution structure; conductive joints disposed on the bottom surface of the redistribution structure; conductive terminals disposed over the top surface of the redistribution structure; a circuit substrate electrically coupled to the redistribution structure through the conductive joints; and an insulating encapsulation disposed on the bottom surface of the redistribution structure to cover the circuit substrate.

2. The semiconductor structure of claim 1, wherein the redistribution structure comprises:
   a first dielectric layer located at the bottom surface of the redistribution structure;
   a first conductive pattern embedded in the first dielectric layer, wherein the first conductive pattern is substantially flush with the first dielectric layer, and the conductive joints are in contact with the first conductive pattern;
   an N-th dielectric layer located at the top surface of the redistribution structure; and
   an N-th conductive pattern disposed under the N-th dielectric layer, wherein the conductive terminals are electrically connected with the N-th conductive pattern through vias in the N-th dielectric layer.

3. The semiconductor structure of claim 2, wherein the first conductive pattern comprises a first under-bump metallization (UBM) pattern, and the conductive joints are in contact with the first UBM pattern.

4. The semiconductor structure of claim 3, further comprises:
   a second UBM pattern disposed in the vias in the N-th dielectric layer, the N-th conductive pattern being stacked over and electrically coupled to the first UBM pattern of the redistribution structure and away from the circuit substrate.

5. The semiconductor structure of claim 1, wherein a depth of the gas release trenches is in a range from 5 μm to 50 μm.

6. The semiconductor structure of claim 1, wherein a width of the conductive terminals is less than a width of the conductive joints.

7. The semiconductor structure of claim 1, wherein two ends of each of the gas release trenches are connected with the sidewall of the redistribution structure.

8. The semiconductor structure of claim 1, wherein the redistribution structure comprises the gas release trenches extending along different directions.

9. A circuit structure, comprising: a redistribution structure comprising a first side, a second side opposite to the first side, and a side surface located between the first side and the second side, wherein gas release trenches are extending along the second side of the redistribution structure, wherein two ends of each of the gas release trenches are connected with the side surface of the redistribution structure; conductive joints disposed on the first side of the redistribution structure; conductive terminals disposed over the second side of the redistribution structure; a circuit substrate electrically connected to the conductive joints; and an insulating encapsulation disposed on the first side of the redistribution structure to cover the circuit substrate.

10. The circuit structure of claim 9, wherein the redistribution structure comprises:
    a first dielectric layer located at the first side of the redistribution structure;
    a first conductive pattern embedded in the first dielectric layer, wherein the conductive joints are in contact with the first conductive pattern;
    an N-th dielectric layer located at the second side of the redistribution structure; and
    an N-th conductive pattern embedded in the N-th dielectric layer, wherein the conductive terminals are electrically connected with the N-th conductive pattern, and wherein a portion of the N-th conductive pattern is surrounded by the gas release trenches.

11. The circuit structure of claim 10, wherein the first conductive pattern comprises a first under-bump metallization (UBM) pattern, and the conductive joints are in contact with the first UBM pattern.

12. The circuit structure of claim 11, further comprises:
    a second UBM pattern disposed in vias in the N-th dielectric layer, wherein the N-th conductive pattern is stacked over and electrically coupled to the first UBM pattern of the redistribution structure and away from the circuit substrate.

13. The circuit structure of claim 9, wherein a depth of the gas release trenches is in a range from 5 μm to 50 μm.

14. The circuit structure of claim 9, wherein a width of the conductive terminals is less than a width of the conductive joints.

15. The circuit structure of claim 9, wherein the redistribution structure comprises the gas release trenches extending along different directions.

16. A circuit structure, comprising: a redistribution structure comprising a first side, a second side opposite to the first side, and a side surface located between the first side and the second side, wherein
    gas release channels are located on the second side of the redistribution structure;
    conductive joints disposed on the first side of the redistribution structure;
    conductive terminals disposed over the second side of the redistribution structure, wherein the gas release channels are extending from the side surface of the redistribution structure to between the conductive terminals; and a circuit substrate electrically connected to the conductive joints.

17. The circuit structure of claim 16, wherein a depth of the gas release channels is in a range from 5 μm to 50 μm.

18. The circuit structure of claim 16, wherein a width of the conductive terminals is less than a width of the conductive joints.

19. The circuit structure of claim 16, wherein two ends of each of the gas release channels are connected with the side surface of the redistribution structure.

20. The circuit structure of claim 16, wherein the redistribution structure comprises the gas release channels extending along different directions.

* * * * *